US007980666B2

(12) United States Patent
McAvoy et al.

(10) Patent No.: US 7,980,666 B2
(45) Date of Patent: Jul. 19, 2011

(54) METHOD OF FORMING THERMAL BEND ACTUATOR WITH CONNECTOR POSTS CONNECTED TO DRIVE CIRCUITRY

(75) Inventors: Gregory John McAvoy, Dublin (IE); Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 0 days.

(21) Appl. No.: 12/972,506

(22) Filed: Dec. 19, 2010

(65) Prior Publication Data

US 2011/0086446 A1 Apr. 14, 2011

Related U.S. Application Data

(63) Continuation of application No. 11/763,440, filed on Jun. 15, 2007, now Pat. No. 7,866,795.

(51) Int. Cl.

*B41J 2/16* (2006.01)
*B41J 2/135* (2006.01)
*G01D 15/00* (2006.01)
*H01L 21/00* (2006.01)

(52) U.S. Cl. ................. 347/50; 347/44; 216/27; 438/21

(58) Field of Classification Search ........................ None
See application file for complete search history.

(56) References Cited

U.S. PATENT DOCUMENTS

| | | | | |
|---|---|---|---|---|
| 6,217,153 | B1 * | 4/2001 | Silverbrook | 347/54 |
| 6,245,246 | B1 * | 6/2001 | Silverbrook | 216/27 |
| 6,265,301 | B1 | 7/2001 | Lee et al. | |
| 6,332,669 | B1 | 12/2001 | Kato et al. | |
| 6,416,168 | B1 | 7/2002 | Silverbrook | |
| 7,347,952 | B2 * | 3/2008 | Silverbrook | 216/27 |
| 7,398,597 | B2 * | 7/2008 | Silverbrook | 29/890.1 |
| 7,819,503 | B2 * | 10/2010 | McAvoy et al. | 347/50 |
| 2004/0119787 | A1 | 6/2004 | Mori | |
| 2004/0155939 | A1 | 8/2004 | Silverbrook | |
| 2006/0050108 | A1 | 3/2006 | Silverbrook | |
| 2006/0066677 | A1 | 3/2006 | Hori | |
| 2007/0103510 | A1 | 5/2007 | Silverbrook | |
| 2008/0151022 | A1 | 6/2008 | Silverbrook et al. | |
| 2008/0289859 | A1 | 11/2008 | Mikado et al. | |

* cited by examiner

*Primary Examiner* — Omar Rojas

(57) ABSTRACT

A method of forming a thermal bend actuator in an inkjet nozzle assembly. The method includes: depositing sidewalls and a roof layer to define a nozzle chamber; defining first and second vias in one sidewall to reveal first and second electrodes; filling the vias with a conductive material using electroless plating to provide first and second connector posts; depositing an active beam material onto the roof layer; etching the active beam material to define a planar active beam member comprising a bent or serpentine beam element; and etching the roof layer to define the thermal bend actuator.

14 Claims, 18 Drawing Sheets

METHOD OF FORMING THERMAL BEND ACTUATOR WITH CONNECTOR POSTS CONNECTED TO DRIVE CIRCUITRY

CROSS REFERENCE

This application is a continuation of U.S. application Ser. No. 11/763,440 filed Jun. 15, 2007 all of which is herein incorporated by reference.

FIELD OF THE INVENTION

This invention relates to inkjet nozzle assemblies and methods of fabricating inkjet nozzle assemblies. It has been developed primarily to reduce electrical losses in supplying power to inkjet actuators.

CROSS REFERENCE TO RELATED APPLICATIONS

The following applications have been filed by the Applicant with this application:

| | | | |
|---|---|---|---|
| 7,819,503 | 11/763,446 | 7,605,009 | 7,568,787 |

The disclosures of these co-pending applications are incorporated herein by reference. The above applications have been identified by their filing docket number, which will be substituted with the corresponding application number, once assigned.

The following patents or patent applications filed by the applicant or assignee of the present invention are hereby incorporated by cross-reference.

| | | | | |
|---|---|---|---|---|
| 6,405,055 | 6,628,430 | 7,136,186 | 7,286,260 | 7,145,689 |
| 7,130,075 | 7,081,974 | 7,177,055 | 7,209,257 | 7,161,715 |
| 7,154,632 | 7,158,258 | 7,148,993 | 7,075,684 | 7,564,580 |
| 7,241,005 | 7,108,437 | 6,915,140 | 6,999,206 | 7,136,198 |
| 7,092,130 | 6,750,901 | 6,476,863 | 6,788,336 | 6,322,181 |
| 7,249,108 | 6,566,858 | 6,331,946 | 6,246,970 | 6,442,525 |
| 7,346,586 | 7,685,423 | 6,374,354 | 7,246,098 | 6,816,968 |
| 6,757,832 | 6,334,190 | 6,745,331 | 7,249,109 | 7,197,642 |
| 7,093,139 | 7,509,292 | 7,685,424 | 7,743,262 | 7,210,038 |
| 7,401,223 | 7,702,926 | 7,716,098 | 7,757,084 | 7,747,541 |
| 7,657,488 | 7,170,652 | 6,967,750 | 6,995,876 | 7,099,051 |
| 7,453,586 | 7,193,734 | 7,773,245 | 7,468,810 | 7,095,533 |
| 6,914,686 | 7,161,709 | 7,099,033 | 7,364,256 | 7,258,417 |
| 7,293,853 | 7,328,968 | 7,270,395 | 7,461,916 | 7,510,264 |
| 7,334,864 | 7,255,419 | 7,284,819 | 7,229,148 | 7,258,416 |
| 7,273,263 | 7,270,393 | 6,984,017 | 7,347,526 | 7,357,477 |
| 7,780,261 | 7,465,015 | 7,364,255 | 7,357,476 | 7,758,148 |
| 7,284,820 | 7,341,328 | 7,246,875 | 7,322,669 | 7,445,311 |
| 7,452,052 | 7,455,383 | 7,448,724 | 7,441,864 | 7,637,588 |
| 7,648,222 | 7,669,958 | 7,607,755 | 7,699,433 | 7,658,463 |
| 7,344,226 | 7,328,976 | 7,794,613 | 7,669,967 | 11/685,090 |
| 11/740,925 | 11/518,238 | 11/518,280 | 7,663,784 | 11/518,242 |
| 7,331,651 | 7,334,870 | 7,334,875 | 7,416,283 | 7,438,386 |
| 7,461,921 | 7,506,958 | 7,472,981 | 7,448,722 | 7,575,297 |
| 7,438,381 | 7,441,863 | 7,438,382 | 7,425,051 | 7,399,057 |
| 7,695,097 | 7,686,419 | 7,753,472 | 7,448,720 | 7,448,723 |
| 7,445,310 | 7,399,054 | 7,425,049 | 7,367,648 | 7,370,936 |
| 7,401,886 | 7,506,952 | 7,401,887 | 7,384,119 | 7,401,888 |
| 7,387,358 | 7,413,281 | 7,530,663 | 7,467,846 | 7,669,957 |
| 7,771,028 | 7,758,174 | 7,695,123 | 7,798,600 | 7,604,334 |
| 11/482,987 | 7,708,375 | 7,695,093 | 7,695,098 | 7,722,156 |
| 7,703,882 | 7,510,261 | 7,722,153 | 7,581,812 | 7,641,304 |
| 7,753,470 | 6,227,652 | 6,213,588 | 6,213,589 | 6,231,163 |
| 6,247,795 | 6,394,581 | 6,244,691 | 6,257,704 | 6,416,168 |
| 6,220,694 | 6,257,705 | 6,247,794 | 6,234,610 | 6,247,793 |

-continued

| | | | | |
|---|---|---|---|---|
| 6,264,306 | 6,241,342 | 6,247,792 | 6,264,307 | 6,254,220 |
| 6,234,611 | 6,302,528 | 6,283,582 | 6,239,821 | 6,338,547 |
| 6,247,796 | 6,557,977 | 6,390,603 | 6,362,843 | 6,293,653 |
| 6,312,107 | 6,227,653 | 6,234,609 | 6,238,040 | 6,188,415 |
| 6,227,654 | 6,209,989 | 6,247,791 | 6,336,710 | 6,217,153 |
| 6,416,167 | 6,243,113 | 6,283,581 | 6,247,790 | 6,260,953 |
| 6,267,469 | 6,588,882 | 6,742,873 | 6,918,655 | 6,547,371 |
| 6,938,989 | 6,598,964 | 6,923,526 | 6,273,544 | 6,309,048 |
| 6,420,196 | 6,443,558 | 6,439,689 | 6,378,989 | 6,848,181 |
| 6,634,735 | 6,299,289 | 6,299,290 | 6,425,654 | 6,902,255 |
| 6,623,101 | 6,406,129 | 6,505,916 | 6,457,809 | 6,550,895 |
| 6,457,812 | 7,152,962 | 6,428,133 | 7,216,956 | 7,080,895 |
| 7,442,317 | 7,182,437 | 7,357,485 | 7,387,368 | 11/607,976 |
| 7,618,124 | 7,654,641 | 7,794,056 | 7,611,225 | 7,794,055 |
| 7,748,827 | 7,735,970 | 7,637,582 | 7,419,247 | 7,384,131 |
| 7,416,280 | 7,252,366 | 7,488,051 | 7,360,865 | 7,733,535 |
| 11/563,684 | 11/482,967 | 11/482,966 | 11/482,988 | 7,681,000 |
| 7,438,371 | 7,465,017 | 7,441,862 | 7,654,636 | 7,458,659 |
| 7,455,376 | 11/124,158 | 11/124,196 | 11/124,199 | 11/124,162 |
| 11/124,202 | 7,735,993 | 11/124,198 | 7,284,921 | 11/124,151 |
| 7,407,257 | 7,470,019 | 7,645,022 | 7,392,950 | 11/124,149 |
| 7,360,880 | 7,517,046 | 7,236,271 | 11/124,174 | 7,753,517 |
| 7,824,031 | 7,465,047 | 7,607,774 | 7,780,288 | 11/124,172 |
| 7,566,182 | 11/124,184 | 11/124,182 | 7,715,036 | 11/124,171 |
| 11/124,181 | 7,697,159 | 7,595,904 | 7,726,764 | 7,770,995 |
| 7,466,993 | 7,370,932 | 7,404,616 | 11/124,187 | 7,740,347 |
| 7,500,268 | 7,558,962 | 7,447,908 | 7,792,298 | 7,661,813 |
| 7,456,994 | 7,431,449 | 7,466,444 | 11/124,179 | 7,680,512 |
| 11/187,976 | 7,562,973 | 7,530,446 | 7,628,467 | 7,761,090 |
| 11/228,500 | 7,668,540 | 7,738,862 | 7,805,162 | 11/228,531 |
| 11/228,504 | 7,738,919 | 11/228,507 | 7,708,203 | 11/228,505 |
| 7,641,115 | 7,697,714 | 7,654,444 | 7,831,244 | 7,499,765 |
| 11/228,518 | 7,756,526 | 11/228,496 | 7,558,563 | 11/228,506 |
| 11/228,516 | 11/228,526 | 7,747,280 | 7,742,755 | 7,738,674 |
| 11/228,523 | 7,506,802 | 7,724,399 | 11/228,527 | 7,403,797 |
| 11/228,520 | 7,646,503 | 11/228,511 | 7,672,664 | 11/228,515 |
| 7,783,323 | 11/228,534 | 7,778,666 | 11/228,509 | 11/228,492 |
| 7,558,599 | 11/228,510 | 11/228,508 | 11/228,514 | 11/228,494 |
| 7,438,215 | 7,689,249 | 7,621,442 | 7,575,172 | 7,357,311 |
| 7,380,709 | 7,428,986 | 7,403,796 | 7,407,092 | 11/228,513 |
| 7,637,424 | 7,469,829 | 7,774,025 | 7,558,597 | 7,558,598 |
| 6,087,638 | 6,340,222 | 6,041,600 | 6,299,300 | 6,067,797 |
| 6,286,935 | 6,044,646 | 6,382,769 | 6,787,051 | 6,938,990 |
| 7,588,693 | 7,416,282 | 7,481,943 | 7,152,972 | 7,513,615 |
| 6,746,105 | 7,744,195 | 7,645,026 | 7,322,681 | 7,708,387 |
| 7,753,496 | 7,712,884 | 7,510,267 | 7,465,041 | 11/246,712 |
| 7,465,032 | 7,401,890 | 7,401,910 | 7,470,010 | 7,735,971 |
| 7,431,432 | 7,465,037 | 7,445,317 | 7,549,735 | 7,597,425 |
| 7,661,800 | 7,712,869 | 7,156,508 | 7,159,972 | 7,083,271 |
| 7,165,834 | 7,080,894 | 7,201,469 | 7,090,336 | 7,156,489 |
| 7,413,283 | 7,438,385 | 7,083,257 | 7,258,422 | 7,255,423 |
| 7,219,980 | 7,591,533 | 7,416,274 | 7,367,649 | 7,118,192 |
| 7,618,121 | 7,322,672 | 7,077,505 | 7,198,354 | 7,077,504 |
| 7,614,724 | 7,198,355 | 7,401,894 | 7,322,676 | 7,152,959 |
| 7,213,906 | 7,178,901 | 7,222,938 | 7,108,353 | 7,104,629 |
| 7,455,392 | 7,370,939 | 7,429,095 | 7,404,621 | 7,261,401 |
| 7,461,919 | 7,438,388 | 7,328,972 | 7,322,673 | 7,306,324 |
| 7,306,325 | 7,524,021 | 7,399,071 | 7,556,360 | 7,303,261 |
| 7,568,786 | 7,517,049 | 7,549,727 | 7,399,053 | 7,467,849 |
| 7,303,930 | 7,401,405 | 7,464,466 | 7,464,465 | 7,246,886 |
| 7,128,400 | 7,108,355 | 6,991,322 | 7,287,836 | 7,118,197 |
| 7,575,298 | 7,364,269 | 7,077,493 | 6,962,402 | 7,686,429 |
| 7,147,308 | 7,524,034 | 7,118,198 | 7,168,790 | 7,172,270 |
| 7,229,155 | 6,830,318 | 7,195,342 | 7,175,261 | 7,465,035 |
| 7,108,356 | 7,118,202 | 7,510,269 | 7,134,744 | 7,510,270 |
| 7,134,743 | 7,182,439 | 7,210,768 | 7,465,036 | 7,134,745 |
| 7,156,484 | 7,118,201 | 7,111,926 | 7,431,433 | 7,018,021 |
| 7,401,901 | 7,468,139 | 7,128,402 | 7,387,369 | 7,484,832 |
| 7,802,871 | 7,506,968 | 7,284,839 | 7,246,885 | 7,229,156 |
| 7,533,970 | 7,467,855 | 7,293,858 | 7,520,594 | 7,588,321 |
| 7,258,427 | 7,556,350 | 7,278,716 | 11/603,825 | 7,524,028 |
| 7,467,856 | 7,469,996 | 7,506,963 | 7,533,968 | 7,556,354 |
| 7,524,030 | 7,581,822 | 7,448,729 | 7,246,876 | 7,431,431 |
| 7,419,249 | 7,377,623 | 7,328,978 | 7,334,876 | 7,147,306 |
| 7,261,394 | 7,654,645 | 7,784,915 | 7,491,911 | 7,721,948 |
| 7,079,712 | 6,825,945 | 7,330,974 | 6,813,039 | 6,987,506 |
| 7,038,797 | 6,980,318 | 6,816,274 | 7,102,772 | 7,350,236 |
| 6,681,045 | 6,728,000 | 7,173,722 | 7,088,459 | 7,707,082 |
| 7,068,382 | 7,062,651 | 6,789,194 | 6,789,191 | 6,644,642 |
| 6,502,614 | 6,622,999 | 6,669,385 | 6,549,935 | 6,987,573 |

-continued

| | | | | |
|---|---|---|---|---|
| 6,727,996 | 6,591,884 | 6,439,706 | 6,760,119 | 7,295,332 |
| 6,290,349 | 6,428,155 | 6,785,016 | 6,870,966 | 6,822,639 |
| 6,737,591 | 7,055,739 | 7,233,320 | 6,830,196 | 6,832,717 |
| 6,957,768 | 7,456,820 | 7,170,499 | 7,106,888 | 7,123,239 |
| 7,468,284 | 7,341,330 | 7,372,145 | 7,425,052 | 7,287,831 |
| 10/727,162 | 7,377,608 | 7,399,043 | 7,121,639 | 7,165,824 |
| 7,152,942 | 7,818,519 | 7,181,572 | 7,096,137 | 7,302,592 |
| 7,278,034 | 7,188,282 | 7,592,829 | 10/727,192 | 7,770,008 |
| 7,707,621 | 7,523,111 | 7,573,301 | 7,660,998 | 7,783,886 |
| 7,831,827 | 10/727,160 | 7,171,323 | 7,278,697 | 7,360,131 |
| 7,519,772 | 7,328,115 | 7,747,887 | 7,805,626 | 7,369,270 |
| 6,795,215 | 7,070,098 | 7,154,638 | 6,805,419 | 6,859,289 |
| 6,977,751 | 6,398,332 | 6,394,573 | 6,622,923 | 6,747,760 |
| 6,921,144 | 7,092,112 | 7,192,106 | 7,457,001 | 7,173,739 |
| 6,986,560 | 7,008,033 | 7,551,324 | 7,222,780 | 7,270,391 |
| 7,525,677 | 7,388,689 | 7,398,916 | 7,571,906 | 7,654,628 |
| 7,611,220 | 7,556,353 | 7,195,328 | 7,182,422 | 11/650,537 |
| 11/712,540 | 7,374,266 | 7,427,117 | 7,448,707 | 7,281,330 |
| 7,328,956 | 7,735,944 | 7,188,928 | 7,093,989 | 7,377,609 |
| 7,600,843 | 10/854,498 | 7,390,071 | 7,549,715 | 7,252,353 |
| 7,607,757 | 7,267,417 | 7,517,036 | 7,275,805 | 7,314,261 |
| 7,281,777 | 7,290,852 | 7,484,831 | 7,758,143 | 7,832,842 |
| 7,549,718 | 10/854,520 | 7,631,190 | 7,557,941 | 7,757,086 |
| 10/854,501 | 7,266,661 | 7,243,193 | 10/854,518 | 7,163,345 |
| 7,322,666 | 7,566,111 | 7,434,910 | 7,837,284 | 11/748,483 |
| 11/749,123 | 7,543,808 | 11/544,764 | 7,819,494 | 11/544,772 |
| 11/544,774 | 11/544,775 | 7,425,048 | 11/544,766 | 7,780,256 |
| 7,384,128 | 7,604,321 | 7,722,163 | 7,681,970 | 7,425,047 |
| 7,413,288 | 7,465,033 | 7,452,055 | 7,470,002 | 7,722,161 |
| 7,475,963 | 7,448,735 | 7,465,042 | 7,448,739 | 7,438,399 |
| 11/293,794 | 7,467,853 | 7,461,922 | 7,465,020 | 7,722,185 |
| 7,461,910 | 7,270,494 | 7,632,032 | 7,475,961 | 7,547,088 |
| 7,611,239 | 7,735,955 | 7,758,038 | 7,681,876 | 7,780,161 |
| 7,703,903 | 7,703,900 | 7,703,901 | 7,722,170 | 11/640,359 |
| 7,784,925 | 7,794,068 | 7,794,038 | 7,448,734 | 7,425,050 |
| 7,364,263 | 7,201,468 | 7,360,868 | 7,234,802 | 7,303,255 |
| 7,287,846 | 7,156,511 | 10/760,264 | 7,258,432 | 7,097,291 |
| 7,645,025 | 10/760,248 | 7,083,273 | 7,367,647 | 7,374,355 |
| 7,441,880 | 7,547,092 | 10/760,206 | 7,513,598 | 10/760,270 |
| 7,198,352 | 7,364,264 | 7,303,251 | 7,201,470 | 7,121,655 |
| 7,293,861 | 7,232,208 | 7,328,985 | 7,344,232 | 7,083,272 |
| 7,311,387 | 7,303,258 | 7,824,002 | 7,517,050 | 7,708,391 |
| 7,621,620 | 7,669,961 | 7,331,663 | 7,360,861 | 7,328,973 |
| 7,427,121 | 7,407,262 | 7,303,252 | 7,249,822 | 7,537,309 |
| 7,311,382 | 7,360,860 | 7,364,257 | 7,390,075 | 7,350,896 |
| 7,429,096 | 7,384,135 | 7,331,660 | 7,416,287 | 7,488,052 |
| 7,322,684 | 7,322,685 | 7,311,381 | 7,270,405 | 7,303,268 |
| 7,470,007 | 7,399,072 | 7,393,076 | 7,681,967 | 7,588,301 |
| 7,249,833 | 7,547,098 | 7,524,016 | 7,490,927 | 7,331,661 |
| 7,524,043 | 7,300,140 | 7,357,492 | 7,357,493 | 7,566,106 |
| 7,380,902 | 7,284,816 | 7,284,845 | 7,255,430 | 7,390,080 |
| 7,328,984 | 7,350,913 | 7,322,671 | 7,380,910 | 7,431,424 |
| 7,470,006 | 7,585,054 | 7,347,534 | 7,441,865 | 7,469,989 |
| 7,367,650 | 7,469,990 | 7,441,882 | 7,556,364 | 7,357,496 |
| 7,467,863 | 7,431,440 | 7,431,443 | 7,527,353 | 7,524,023 |
| 7,513,603 | 7,467,852 | 7,465,045 | 11/688,863 | 7,837,297 |
| 7,475,976 | 7,364,265 | 11/688,867 | 7,758,177 | 7,780,278 |
| 11/688,871 | 7,819,507 | 7,654,640 | 7,721,441 | 7,645,034 |
| 7,637,602 | 7,645,033 | 7,661,803 | 11/495,819 | 7,771,029 |
| 11/677,050 | 7,658,482 | 7,306,320 | 7,111,935 | 7,562,971 |
| 7,735,982 | 7,604,322 | 7,261,482 | 7,002,664 | 7,088,420 |
| 11/446,233 | 7,470,014 | 7,470,020 | 7,540,601 | 7,654,761 |
| 7,377,635 | 7,686,446 | 7,237,888 | 7,168,654 | 7,201,272 |
| 6,991,098 | 7,217,051 | 6,944,970 | 10/760,215 | 7,108,434 |
| 7,210,407 | 7,186,042 | 6,920,704 | 7,217,049 | 7,607,756 |
| 7,147,102 | 7,287,828 | 7,249,838 | 7,431,446 | 7,611,237 |
| 7,261,477 | 7,225,739 | 7,712,886 | 7,665,836 | 7,419,053 |
| 7,191,978 | 7,524,046 | 7,163,287 | 7,258,415 | 7,322,677 |
| 7,258,424 | 7,484,841 | 7,195,412 | 7,207,670 | 7,270,401 |
| 7,220,072 | 7,588,381 | 7,726,785 | 7,578,387 | 7,575,316 |
| 7,384,206 | 7,628,557 | 7,470,074 | 7,425,063 | 7,429,104 |
| 7,556,446 | 7,367,267 | 11/754,359 | 7,695,204 | 7,322,761 |
| 7,735,994 | 7,079,292 | | | |

BACKGROUND OF THE INVENTION

The present Applicant has described previously a plethora of MEMS inkjet nozzles using thermal bend actuation. Thermal bend actuation generally means bend movement generated by thermal expansion of one material, having a current passing therethough, relative to another material. The resulting bend movement may be used to eject ink from a nozzle opening, optionally via movement of a paddle or vane, which creates a pressure wave in a nozzle chamber.

Some representative types of thermal bend inkjet nozzles are exemplified in the patents and patent applications listed in the cross reference section above, the contents of which are incorporated herein by reference.

The Applicant's U.S. Pat. No. 6,416,167 describes an inkjet nozzle having a paddle positioned in a nozzle chamber and a thermal bend actuator positioned externally of the nozzle chamber. The actuator takes the form of a lower active beam of conductive material (e.g. titanium nitride) fused to an upper passive beam of non-conductive material (e.g. silicon dioxide). The actuator is connected to the paddle via an arm received through a slot in the wall of the nozzle chamber. Upon passing a current through the lower active beam, the actuator bends upwards and, consequently, the paddle moves towards a nozzle opening defined in a roof of the nozzle chamber, thereby ejecting a droplet of ink. An advantage of this design is its simplicity of construction. A drawback of this design is that both faces of the paddle work against the relatively viscous ink inside the nozzle chamber.

The Applicant's U.S. Pat. No. 6,260,953 describes an inkjet nozzle in which the actuator forms a moving roof portion of the nozzle chamber. The actuator takes the form of a serpentine core of conductive material encased by a polymeric material. Upon actuation, the actuator bends towards a floor of the nozzle chamber, increasing the pressure within the chamber and forcing a droplet of ink from a nozzle opening defined in the roof of the chamber. The nozzle opening is defined in a non-moving portion of the roof. An advantage of this design is that only one face of the moving roof portion has to work against the relatively viscous ink inside the nozzle chamber. A drawback of this design is that construction of the actuator from a serpentine conductive element encased by polymeric material is difficult to achieve in a MEMS fabrication process.

The Applicant's U.S. Pat. No. 6,623,101 describes an inkjet nozzle comprising a nozzle chamber with a moveable roof portion having a nozzle opening defined therein. The moveable roof portion is connected via an arm to a thermal bend actuator positioned externally of the nozzle chamber. The actuator takes the form of an upper active beam spaced apart from a lower passive beam. By spacing the active and passive beams apart, thermal bend efficiency is maximized since the passive beam cannot act as heat sink for the active beam. Upon passing a current through the active upper beam, the moveable roof portion, having the nozzle opening defined therein, is caused to rotate towards a floor of the nozzle chamber, thereby ejecting through the nozzle opening. Since the nozzle opening moves with the roof portion, drop flight direction may be controlled by suitable modification of the shape of the nozzle rim. An advantage of this design is that only one face of the moving roof portion has to work against the relatively viscous ink inside the nozzle chamber. A further advantage is the minimal thermal losses achieved by spacing apart the active and passive beam members. A drawback of this design is the loss of structural rigidity in spacing apart the active and passive beam members.

In all designs of MEMS inkjet nozzles, there is a need to minimize electrical losses. It is particularly important to minimize electrical losses in cases where the design of the nozzle dictates a disadvantageous configuration from the standpoint of electrical losses. For example, a relatively long distance between an actuator and a CMOS electrode supplying current to the actuator can exacerbate electrical losses. Furthermore, bent or tortuous current paths exacerbate electrical losses.

Usually, the actuator material in inkjet nozzles is selected from a material which fulfils a number of criteria. In the case of mechanical thermal bend-actuated nozzles, these criteria include electrical conductivity, coefficient of thermal expansion, Young's modulus etc. In the case of thermal bubble-forming inkjet nozzles, these criteria include electrical conductivity, resistance to oxidation, resistance to cracking etc. Hence, it will be appreciated that the choice of actuator material is usually a compromise of various properties, and that the actuator material may not necessarily have optimal electrical conductivity. In cases where the actuator material itself has sub-optimal electrical conductivity, it is particularly important to minimize electrical losses elsewhere in the nozzle assembly.

Finally, any improvements in nozzle design should be compatible with standard MEMS fabrication processes. For example, some materials are incompatible with MEMS processing since they lead to contamination of the fab.

From the foregoing, it will appreciated that there is a need to improve on the design and fabrication of inkjet nozzles, so as to minimize electrical losses and to provide more efficient drop ejection in the resultant printhead. There is a particular need to improve on the design and fabrication of mechanical thermal bend-actuated inkjet nozzles, where electrical losses may be exacerbated due to inherent aspects of the nozzle design.

SUMMARY OF THE INVENTION

In a first aspect the present invention provides a method of forming an electrical connection between an electrode and an actuator in an inkjet nozzle assembly, said method comprising the steps of:

(a) providing a substrate having a layer of drive circuitry, said drive circuitry including the electrode for connection to the actuator;

(b) forming a wall of insulating material over said electrode;

(c) defining a via in at least said wall, said via revealing said electrode;

(d) filling said via with a conductive material using electroless plating to provide a connector post;

(e) forming at least part of the actuator over said connector post, thereby providing electrical connection between the actuator and the electrode.

Optionally, a distance between said actuator and said electrode is at least 5 microns.

Optionally, said layer of drive circuitry is a CMOS layer of a silicon substrate.

Optionally, said drive circuitry includes a pair of electrodes for each inkjet nozzle assembly, each of said electrodes being connected to said actuator with a respective connector post.

Optionally, said wall of insulating material is comprised of silicon dioxide.

Optionally, said via has sidewalls perpendicular to a face of said substrate.

Optionally, said via has a minimum cross-sectional dimension of 1 micron or greater.

Optionally, said conductive material is a metal.

Optionally, said conductive material is copper.

In a another aspect there is provided a method comprising the further step of:

depositing a catalyst layer on a base of said via prior to said electroless plating.

Optionally, said catalyst is palladium.

Optionally, said conductive material is planarized by chemical mechanical planarization prior to forming said actuator.

Optionally, said actuator is a thermal bend actuator comprising a planar active beam member mechanically cooperating with a planar passive beam member.

Optionally, said thermal bend actuator defines, at least partially, a roof of a nozzle chamber for said inkjet nozzle assembly.

Optionally, said wall of insulating material defines a sidewall of said nozzle chamber.

Optionally, step (e) comprises depositing an active beam material onto a passive beam material.

Optionally, said active beam member, comprised of said active beam material, extends from a top of said connector post in a plane perpendicular to said post.

In another aspect present invention provides a method further comprising the step of:

depositing a first metal pad over a top of said connector post prior to deposition of said active beam material, said first metal pad being configured to facilitate current flow from the connector post to the active beam member.

Optionally, said planar active beam member comprises a bent or serpentine beam element, said beam element having a first end positioned over a first connector post and a second end positioned over a second connector post, said first and second connector posts being adjacent each other.

In another aspect the present invention provides a method further comprising the step of:

depositing one or more second metal pads onto said passive beam material prior to deposition of said active beam material, said second metal pad being positioned to facilitate current flow in bend regions of said beam element.

In a second aspect the present invention provides a printhead integrated circuit comprising a substrate having a plurality of inkjet nozzles assemblies formed on a surface of said substrate, said substrate having drive circuitry for supplying power to said nozzle assemblies, each nozzle assembly comprising:

a nozzle chamber for containing ink, said nozzle chamber having a nozzle opening defined therein;

an actuator for ejecting ink through said nozzle opening;

a pair of electrodes positioned at said surface of said substrate, said electrodes being electrically connected to said drive circuitry; and a pair of connector posts, each connector post electrically connecting a respective electrode to said actuator, wherein each connector post extends linearly from a respective electrode to said actuator.

Optionally, each connector post is perpendicular with respect to said surface of said substrate.

Optionally, a shortest distance between said actuator and said electrodes is at least 5 microns.

Optionally, a minimum cross-sectional dimension of said connector posts is 2 microns or greater.

Optionally, said nozzle assemblies are arranged in a plurality of nozzle rows, said nozzle rows extending longitudinally along said substrate.

Optionally, a distance between adjacent nozzle openings within one nozzle row is less than 50 microns.

Optionally, said actuator is a thermal bend actuator comprising a planar active beam member mechanically cooperating with a planar passive beam member.

Optionally, said thermal bend actuator defines, at least partially, a roof of said nozzle chamber, said nozzle opening being defined in said roof.

Optionally, a wall of insulating material defines sidewalls of said nozzle chamber.

Optionally, said active beam member is electrically connected to a top of said connector posts.

Optionally, part of said active beam member is positioned over a top of said connector posts.

In another aspect the present invention provides a printhead integrated circuit further comprising a first metal pad positioned between a top of each conductor post and said active beam member, each first interstitial metal pad being configured to facilitate current flow from a respective connector post to said active beam member.

Optionally, said active beam member is comprised of an active beam material selected from the group comprising: aluminium alloys; titanium nitride and titanium aluminium nitride.

Optionally, said active beam member is comprised of vanadium-aluminium alloy.

Optionally, said planar active beam member comprises a bent or serpentine beam element, said beam element having a first end positioned over a first connector post and a second end positioned over a second connector post, said first and second connector posts being adjacent each other.

In another aspect the present invention provides a printhead integrated circuit further comprising at least one second metal pad, said second metal pad being positioned to facilitate current flow in bend regions of said beam element.

In another aspect the present invention provides a printhead integrated circuit further comprising an exterior surface layer of hydrophobic polymer on said roof.

Optionally, said exterior surface layer defines a planar ink ejection face of said printhead integrated circuit, said planar ink ejection face having no substantial contours apart from said nozzle openings.

Optionally, said hydrophobic polymer mechanically seals a gap between said thermal bend actuator and said nozzle chamber.

In another aspect the present invention provides a pagewidth inkjet printhead comprising a plurality of printhead integrated circuits circuit comprising a substrate having a plurality of inkjet nozzles assemblies formed on a surface of said substrate, said substrate having drive circuitry for supplying power to said nozzle assemblies, each nozzle assembly comprising:

a nozzle chamber for containing ink, said nozzle chamber having a nozzle opening defined therein;

an actuator for ejecting ink through said nozzle opening;

a pair of electrodes positioned at said surface of said substrate, said electrodes being electrically connected to said drive circuitry; and a pair of connector posts, each connector post electrically connecting a respective electrode to said actuator, wherein each connector post extends linearly from a respective electrode to said actuator.

DETAILED DESCRIPTION OF THE INVENTION

Figure 1:
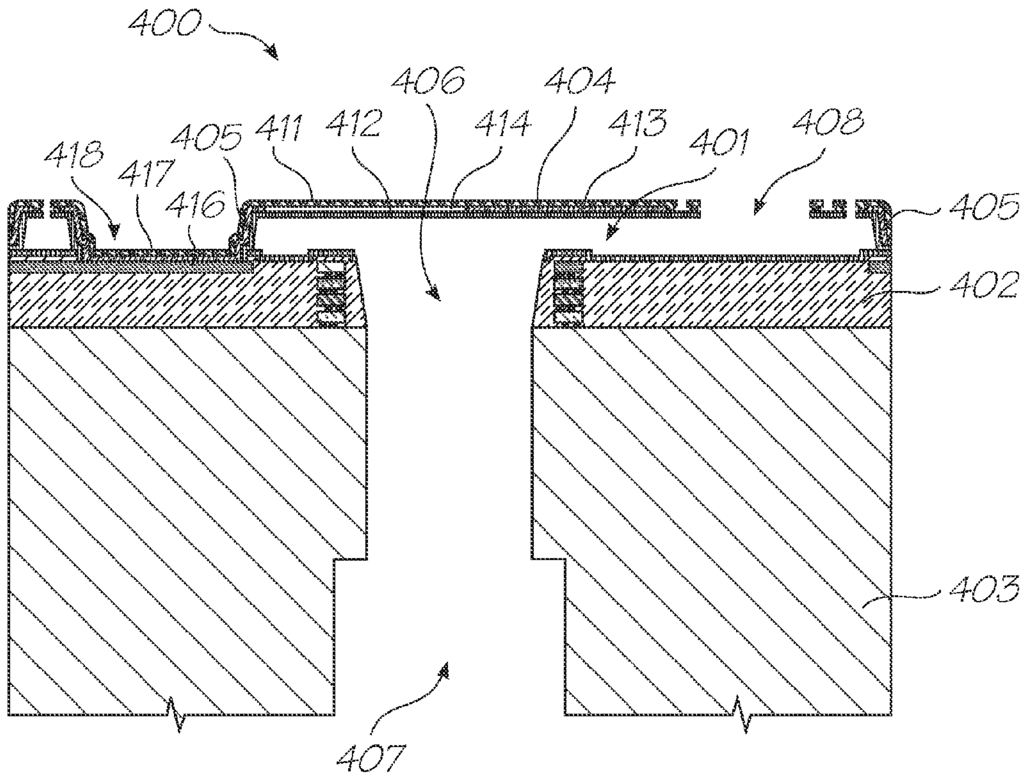
FIG. 1 is a side-sectional view of a thermal bend-actuated inkjet nozzle assembly having a thin, tortuous connection between an electrode and an actuator.
Figure 2:
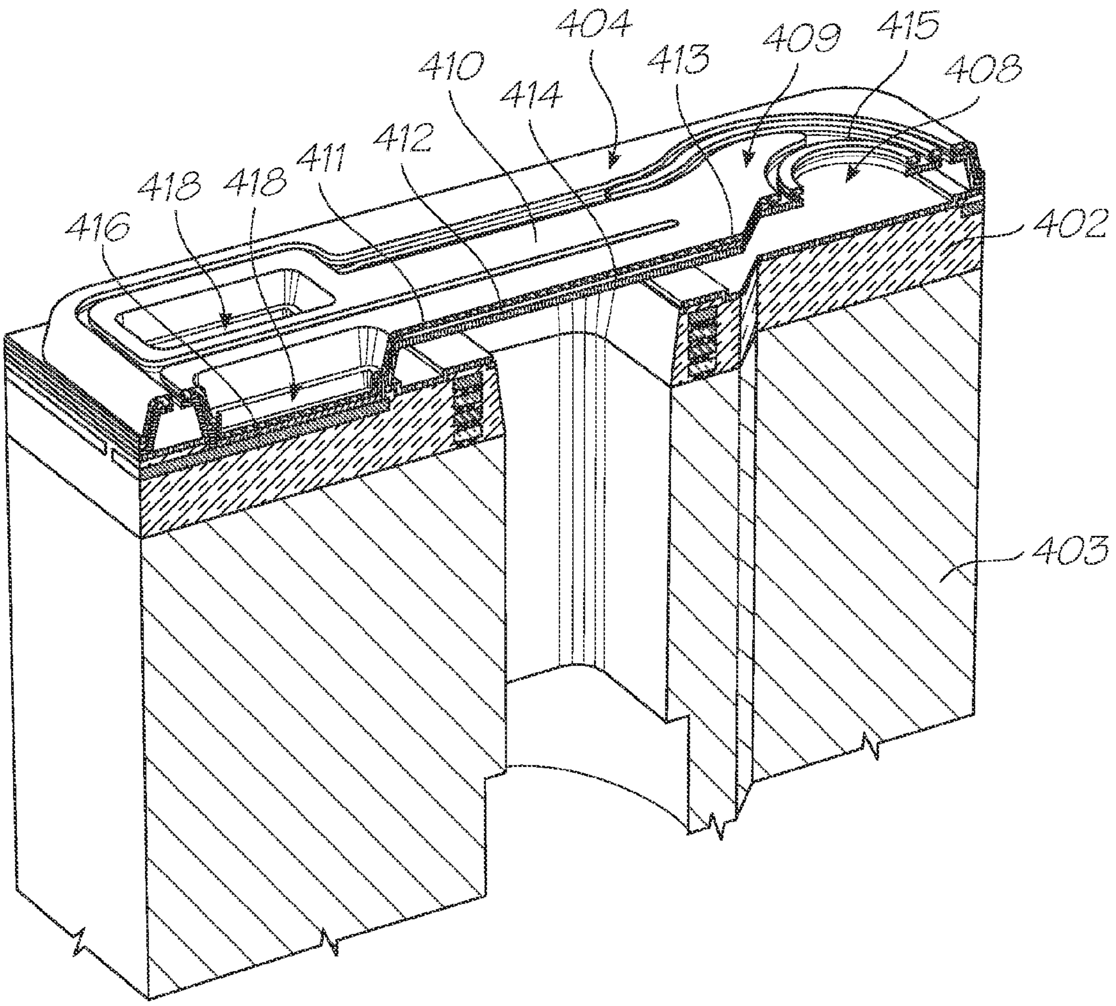
FIG. 2 is a cutaway perspective view of the nozzle assembly shown in FIG. 1.

FIGS. 1 and 2 show a nozzle assembly, as described in the Applicant's earlier filed U.S. application Ser. No. 11/607,976 filed on 4 Dec. 2002, the contents of which is incorporated herein by reference. The nozzle assembly 400 comprises a nozzle chamber 401 formed on a passivated CMOS layer 402 of a silicon substrate 403. The nozzle chamber is defined by a roof 404 and sidewalls 405 extending from the roof to the passivated CMOS layer 402. Ink is supplied to the nozzle chamber 401 by means of an ink inlet 406 in fluid communication with an ink supply channel 407, which receives ink from backside of the silicon substrate 403. Ink is ejected from the nozzle chamber 401 by means of a nozzle opening 408 defined in the roof 404. The nozzle opening 408 is offset from the ink inlet 406.

As shown more clearly in FIG. 2, the roof 404 has a moving portion 409, which defines a substantial part of the total area of the roof. The nozzle opening 408 and nozzle rim 415 are defined in the moving portion 409, such that the nozzle opening and nozzle rim move with the moving portion.

The moving portion 409 is defined by a thermal bend actuator 410 having a planar upper active beam 411 and a planar lower passive beam 412. The active beam 411 is connected to a pair of electrode contacts 416 (positive and ground). The electrodes 416 connect with drive circuitry in the CMOS layers.

When it is required to eject a droplet of ink from the nozzle chamber 401, a current flows through the active beam 411 between the two contacts 416. The active beam 411 is rapidly heated by the current and expands relative to the passive beam 412, thereby causing the actuator 410 (which defines the moving portion 409 of the roof 404) to bend downwards towards the substrate 403. This movement of the actuator 410 causes ejection of ink from the nozzle opening 408 by a rapid increase of pressure inside the nozzle chamber 401. When current stops flowing, the moving portion 409 of the roof 404 is allowed to return to its quiescent position, which sucks ink from the inlet 406 into the nozzle chamber 401, in readiness for the next ejection.

In the nozzle design shown in FIGS. 1 and 2, it is advantageous for the actuator 410 to define at least part of the roof 404 of the nozzle chamber 401. This not only simplifies the overall design and fabrication of the nozzle assembly 400, but also provides higher ejection efficiency because only one face of the actuator 410 has to do work against the relatively viscous ink. By comparison, nozzle assemblies having an actuator paddle positioned inside the nozzle chamber are less efficient, because both faces of the actuator have to do work against the ink inside the chamber.

However, with the actuator 410 defining, at least partially, the roof 404 of the chamber 401, there is inevitably a relatively long distance between the active beam 411 and the electrodes 416 to which the active beam is connected. Furthermore, the current path between the electrode 416 and the active beam 411 is tortuous with a number of turns in the relatively thin layer of beam material. The combination of a relatively large distance between electrode 416 and actuator 410, a tortuous current path, and the thinness of the beam material results in appreciable electrical losses.

Hitherto, MEMS fabrication of inkjet nozzles relied primarily on standard PECVD (plasma-enhanced chemical vapor deposition) and mask/etch steps to build up a nozzle structure. The use of PECVD to deposit simultaneously the active beam 411 and a connection to the electrode 416 has advantages from a MEMS fabrication standpoint, but inevitably leads to a thin, tortuous connection which is disadvantageous in terms of current losses. The current losses are exacerbated further when the beam material does not have optimal conductivity. For example, a vanadium-aluminium alloy has excellent thermoelastic properties, but poorer electrical conductivity compared to, for example, aluminium.

A further disadvantage of PECVD is that a via 418 having sloped sidewalls is required for effective deposition onto the sidewalls. Material cannot be deposited onto vertical sidewalls by PECVD due to the directionality of the plasma. There are several problems associated with sloped via sidewalls. Firstly, a photoresist scaffold having sloped sidewalls is required—this is typically achieved using out-of-focus photoresist exposure, which inevitably leads to some loss of accuracy. Secondly, the total footprint area of the nozzle assembly is increased, thereby reducing nozzle packing density—this increase in area is significantly worsened if the height of the nozzle chamber is increased.

One attempt to alleviate the problem of current losses in the nozzle assembly 400 is to introduce a highly conductive intermediate layer 417, such as titanium or aluminium, between the electrode contact 416 and the active beam material 411 (see FIG. 1). This intermediate layer 417 helps reduce some current losses, but significant current losses still remain.

A further disadvantage of the nozzle assembly shown in FIGS. 1 and 2 is that the ink ejection face of the printhead is non-planar due to the electrode vias 418. Non-planarity of the ink ejection face may lead to structural weaknesses and problems during printhead maintenance.

In light of the above-mentioned problems, the present Applicants have developed a new method for fabricating a mechanical thermal bend inkjet nozzle assembly, which does not rely on PECVD for forming connections from CMOS contacts to the actuator. As will be described in greater detail, the resultant inkjet nozzle assembly has minimal electrical losses and has an additional structural advantage of a planar ink ejection face. Whilst the invention is exemplified with reference to a mechanical thermal bend inkjet nozzle assembly, it will readily appreciated that it may be applied to any type of inkjet nozzle fabricated by MEMS techniques.

Figure 24:
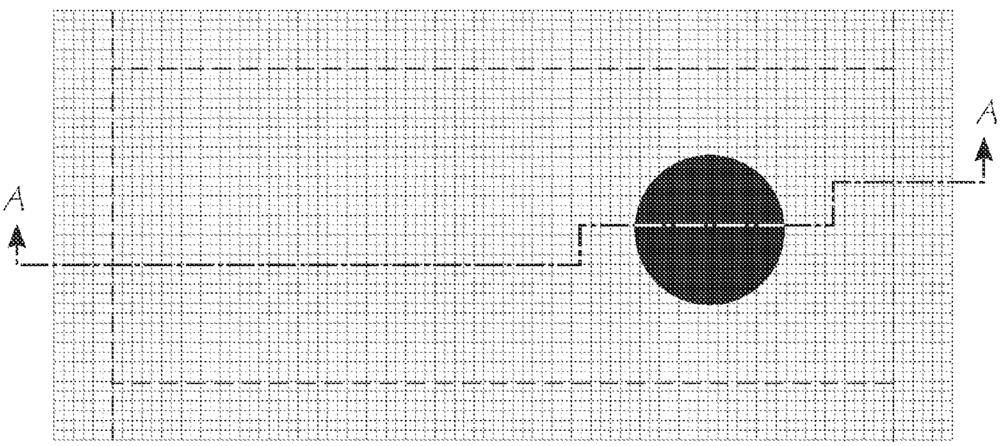
FIG. 24 is a mask for a backside ink supply channel etch.
Figure 25:
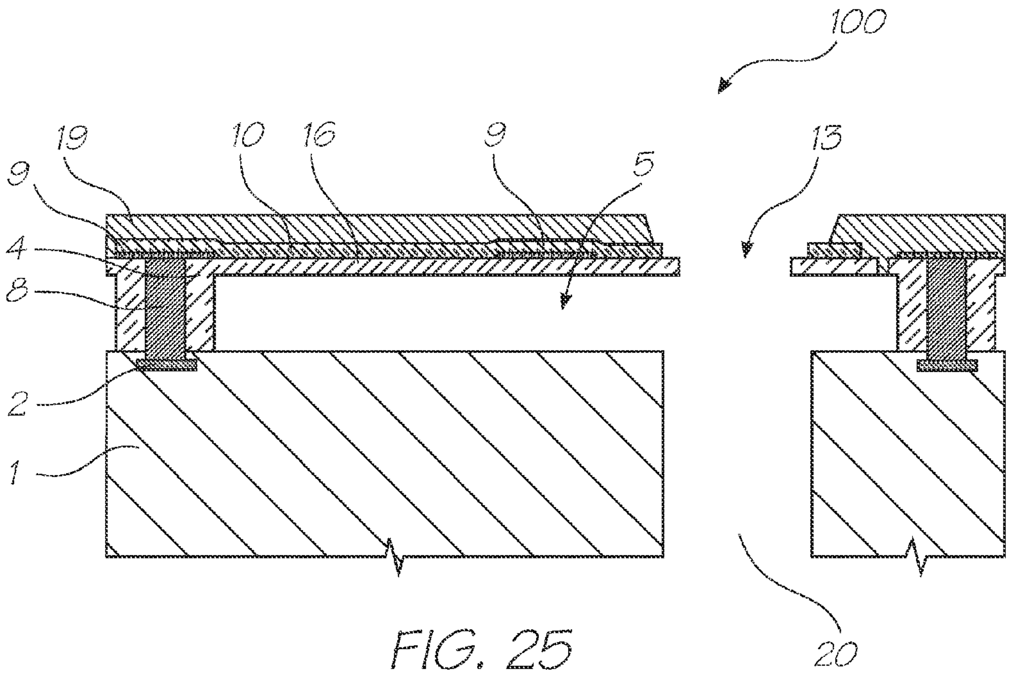
FIG. 25 is a side-sectional view of an inkjet nozzle assembly according to the present invention.
Figure 26:
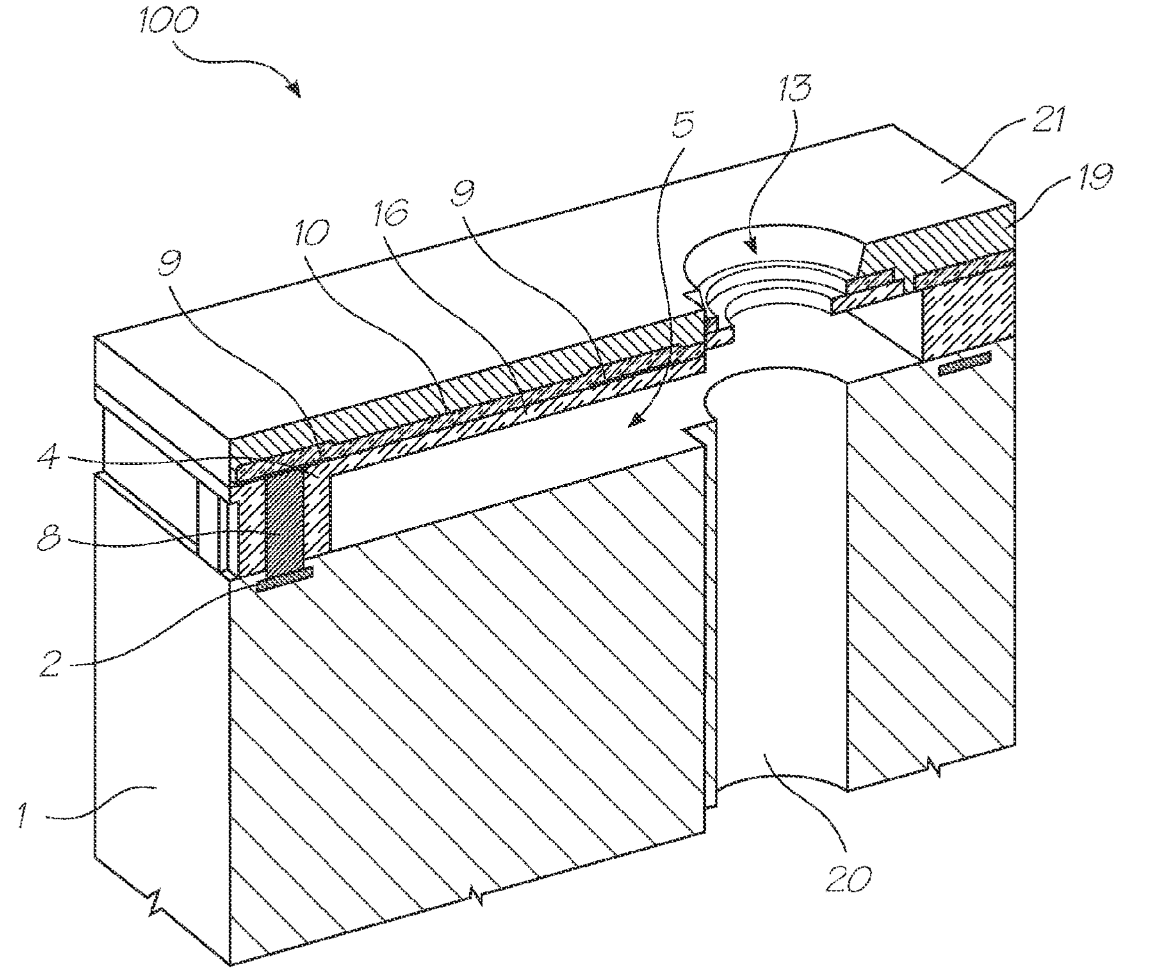
FIG. 26 is a cutaway perspective view of the inkjet nozzle assembly shown in FIG. 25.

FIGS. 3 to 26 shows a sequence of MEMS fabrication steps for an inkjet nozzle assembly 100 shown in FIGS. 25 and 26. The starting point for MEMS fabrication is a standard CMOS wafer having CMOS drive circuitry formed in an upper portion of a silicon wafer. At the end of the MEMS fabrication process, this wafer is diced into individual printhead integrated circuits (ICs), with each IC comprising drive circuitry and plurality of nozzle assemblies.

Figure 4:
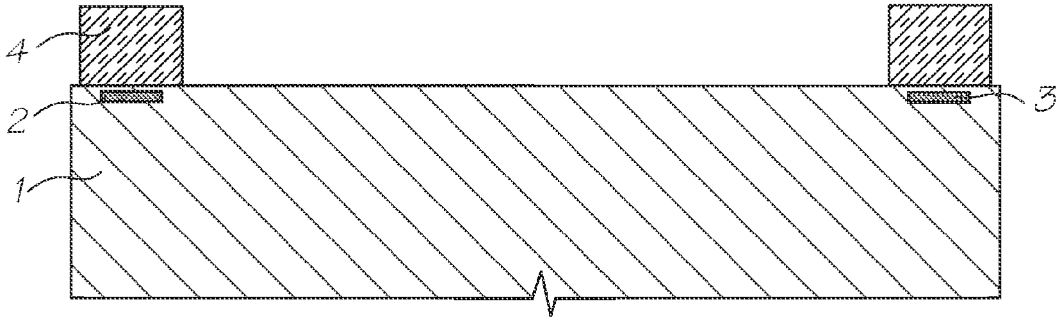
FIG. 4 is a side-sectional view of a partially-fabricated inkjet nozzle assembly after a first sequence of steps in which nozzle chamber sidewalls are formed.
Figure 5:
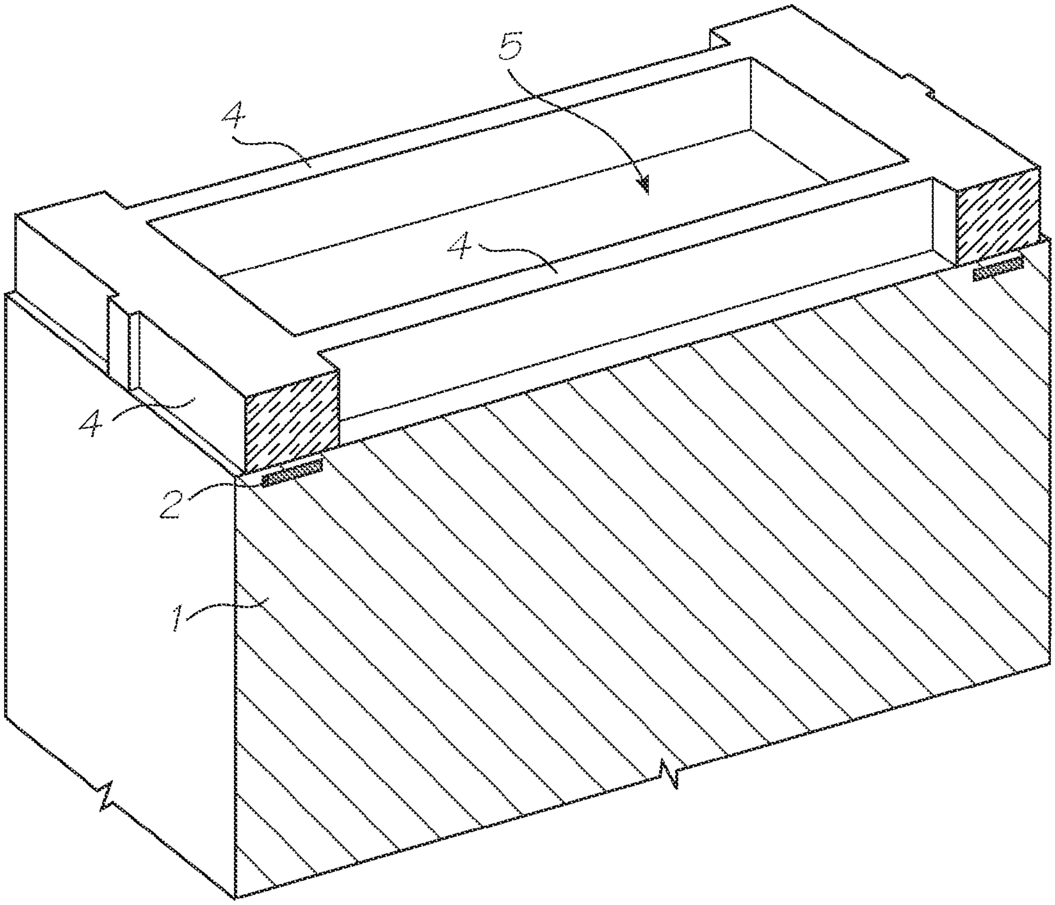
FIG. 5 is a perspective view of the partially-fabricated inkjet nozzle assembly shown in FIG. 4.

As shown in FIGS. 4 and 5, a substrate 1 has an electrode 2 formed in an upper portion thereof. The electrode 2 is one of a pair of adjacent electrodes (positive and earth) for supplying power to an actuator of the inkjet nozzle 100. The electrodes receive power from CMOS drive circuitry (not shown) in upper layers of the substrate 1.

The other electrode 3 shown in FIGS. 4 and 5 is for supplying power to an adjacent inkjet nozzle. In general, the drawings shows MEMS fabrication steps for a nozzle assembly, which is one of an array of nozzle assemblies. The following description focuses on fabrication steps for one of these nozzle assemblies. However, it will of course be appreciated that corresponding steps are being performed simultaneously for all nozzle assemblies that are being formed on the wafer. Where an adjacent nozzle assembly is partially shown in the drawings, this can be ignored for the present purposes. Accordingly, the electrode 3 and all features of the adjacent nozzle assembly will not be described in detail herein. Indeed, in the interests of clarity, some MEMS fabrication steps will not be shown on adjacent nozzle assemblies.

Figure 3:
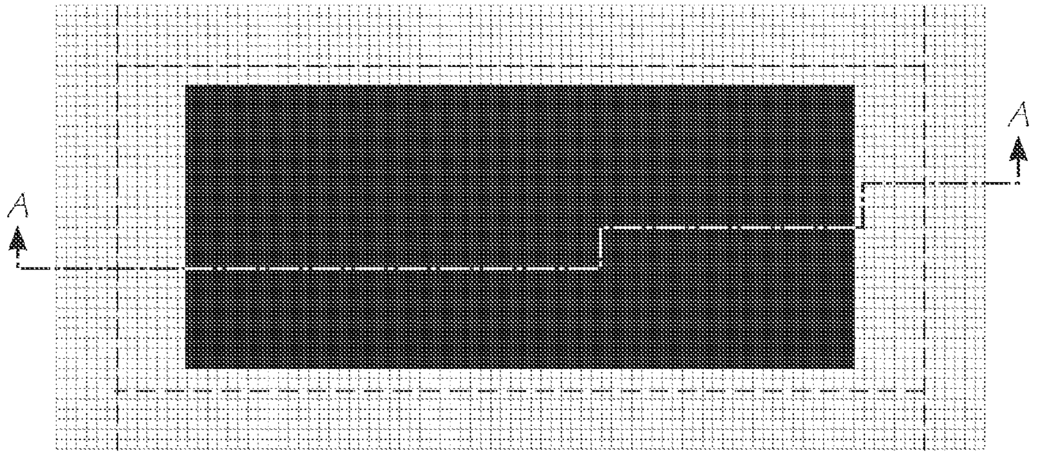
FIG. 3 is a mask for a silicon oxide wall etch.

Turning initially to FIGS. 3 to 5, there is illustrated a first sequence of MEMS fabrication steps starting from a CMOS wafer. An 8 micron layer of silicon dioxide is initially deposited onto the substrate 1. The depth of silicon dioxide defines the depth of a nozzle chamber 5 for the inkjet nozzle. Depending on the size of nozzle chamber 5 required, the layer of silicon dioxide may have a depth of from 4 to 20 microns, or from 6 to 12 microns. It is an advantage of the present invention that it may be used to fabricate nozzle assemblies having relatively deep nozzle chambers (e.g. >6 microns).

After deposition of the $SiO_2$ layer, it is etched to define the wall 4, which will become a sidewall of the nozzle chamber 5, shown most clearly in FIG. 5. The dark tone mask shown in FIG. 3 is used to pattern photoresist (not shown), which defines this etch. Any standard anisotropic DRIE suitable for $SiO_2$ (e.g. $C_4F_8/O_2$ plasma) may be used for this etch step. Furthermore, any depositable insulating material (e.g. silicon nitride, silicon oxynitride, aluminium oxide) may be used instead of $SiO_2$. FIGS. 4 and 5 show the wafer after the first sequence of $SiO_2$ deposition and etch steps.

Figure 6:
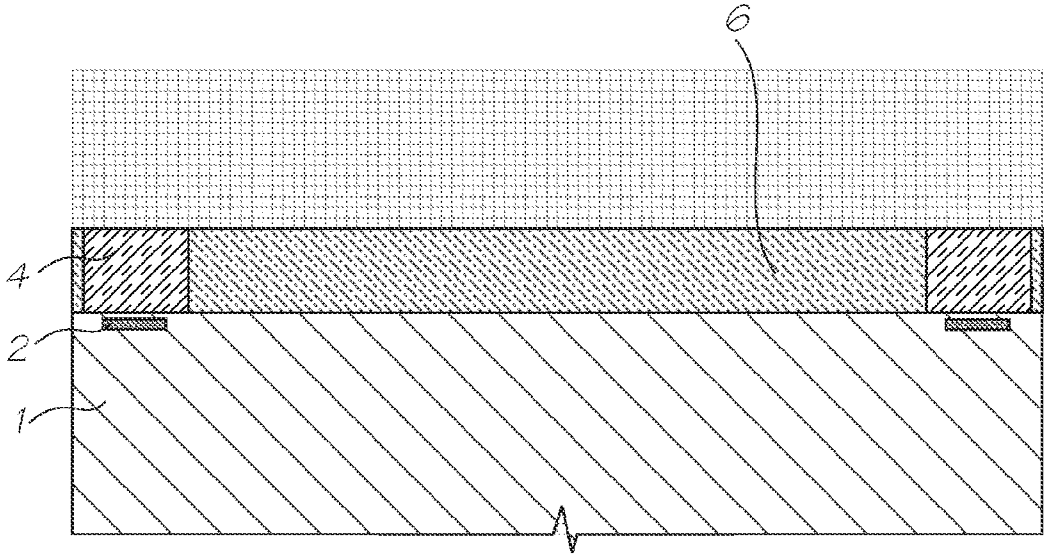
FIG. 6 is a side-sectional view of a partially-fabricated inkjet nozzle assembly after a second sequence of steps in which the nozzle chamber is filled with polyimide.
Figure 7:
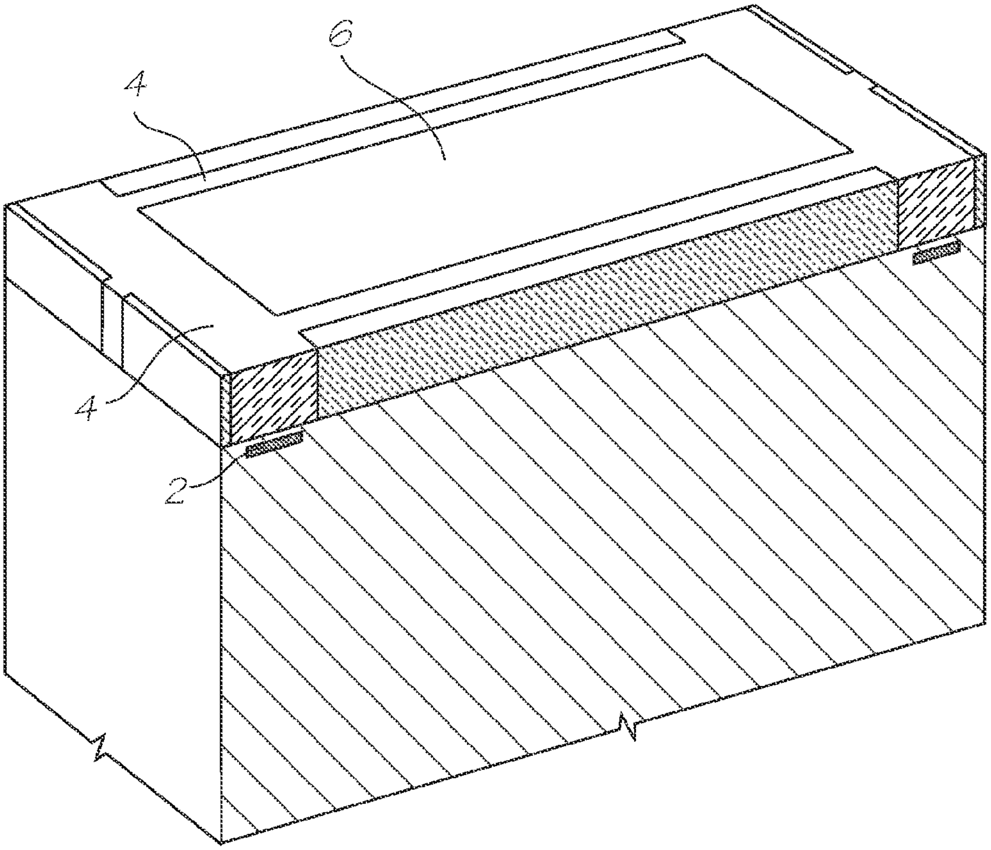
FIG. 7 is a perspective view of the partially-fabricated inkjet nozzle assembly shown in FIG. 6.

In a second sequence of steps the nozzle chamber 5 is filled with photoresist or polyimide 6, which acts as a sacrificial scaffold for subsequent deposition steps. The polyimide 6 is spun onto the wafer using standard techniques, UV cured and/or hardbaked, and then subjected to chemical mechanical planarization (CMP) stopping at the top surface of the $SiO_2$ wall 4. FIGS. 6 and 7 show the nozzle assembly after the second sequence of steps. In preparation for the next deposition step, it is important to ensure that the top surface of the polyimide 6 and the top surface of the $SiO_2$ wall 4 are coplanar. It is also important to ensure that the top surface of the $SiO_2$ wall 4 is clean after CMP, and a brief clean-up etch may be used to ensure this is the case.

Figure 8:
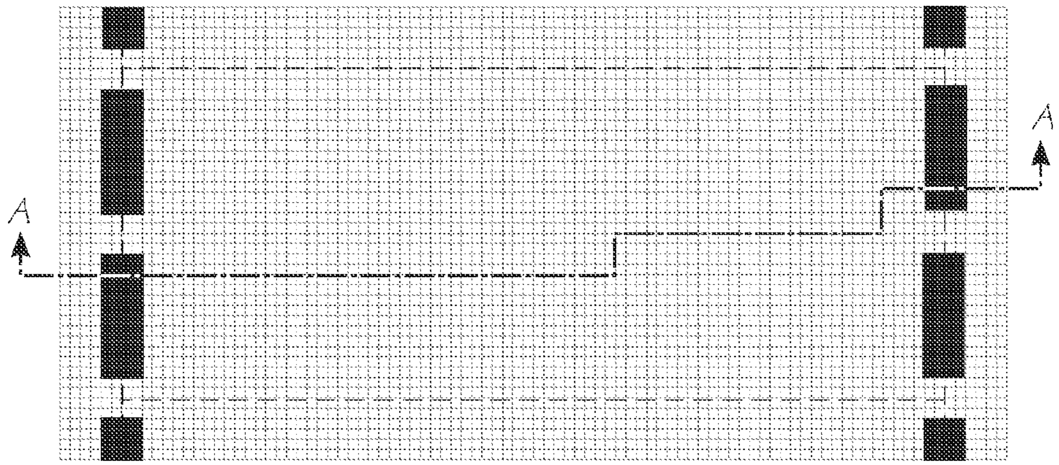
FIG. 8 is a mask for an electrode via etch.

In a third sequence of steps, a roof member 7 of the nozzle chamber 5 is formed as well as highly conductive connector posts 8 down to the electrodes 2. Initially, a 1.7 micron layer of $SiO_2$ is deposited onto the polyimide 6 and wall 4. This layer of $SiO_2$ defines a roof member 7 of the nozzle chamber 5. Next, a pair of vias are formed in the wall 4 down to the electrodes 2 using a standard anisotropic DRIE. The dark tone mask shown in FIG. 8 is used to pattern photoresist (not shown), which defines this etch. The etch is highly anisotropic such that the via sidewalls are preferably perpendicular to the surface of the substrate 1. This means that any depth of nozzle chamber may be accommodated without affecting the overall footprint area of the nozzle assembly on the wafer. This etch exposes the pair of electrodes 2 through respective vias.

Next, the vias are filled with a highly conductive metal, such as copper, using electroless plating. Copper electroless plating methods are well known in the art and may be readily incorporated into a fab. Typically, an electrolyte comprising a copper complex, an aldehyde (e.g. formaldehyde) and a hydroxide base deposits a coating of copper onto exposed surfaces of a substrate. Electroless plating is usually preceded by a very thin coating (e.g. 0.3 microns or less) of a seed metal (e.g. palladium), which catalyses the plating process. Hence, electroless plating of the vias may be preceded by deposition of a suitable catalyst seed layer, such as palladium, by CVD.

Figure 9:
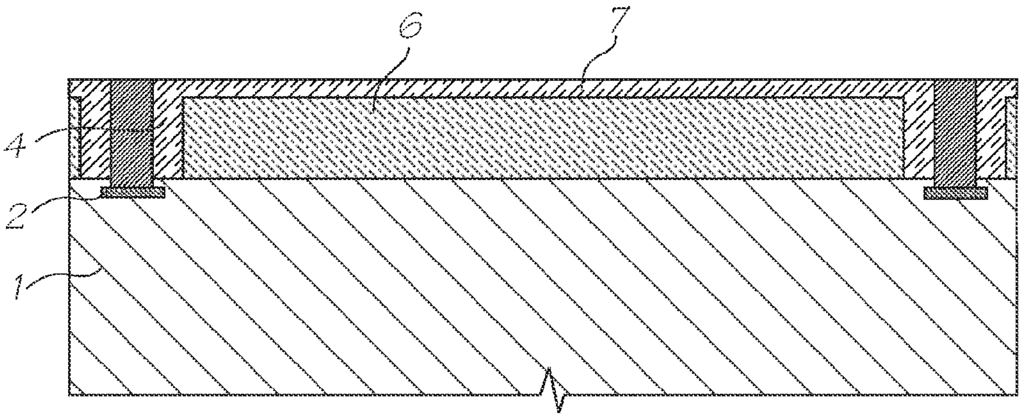
FIG. 9 is a side-sectional view of a partially-fabricated inkjet nozzle assembly after a third sequence of steps in which connector posts are formed up to a chamber roof.
Figure 10:
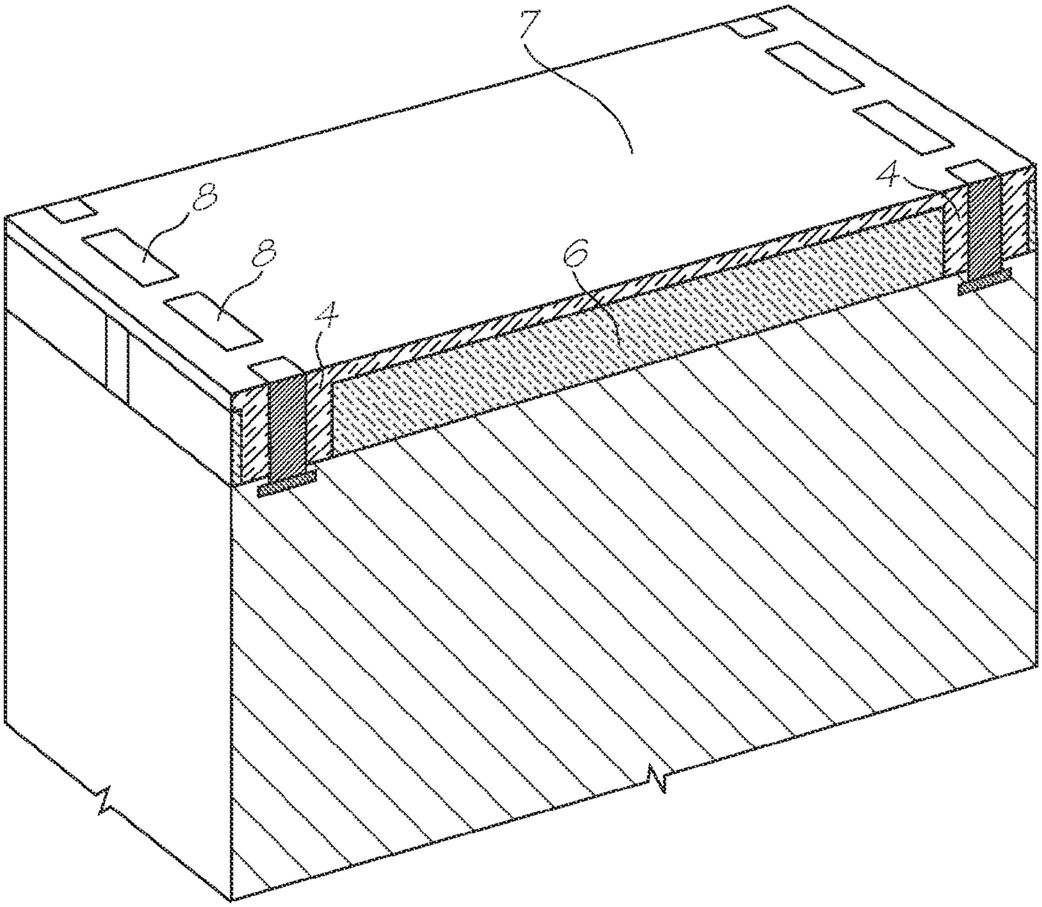
FIG. 10 is a perspective view of the partially-fabricated inkjet nozzle assembly shown in FIG. 9.

In the final step of this third sequence of steps, the deposited copper is subjected to CMP, stopping on the $SiO_2$ roof member 7 to provide a planar structure. FIGS. 9 and 10 show the nozzle assembly following this third sequence of steps. It can be seen that copper connector posts 8, formed during the electroless copper plating, meet with respective electrodes 2 to provide a linear conductive path up to the roof member 7. This conductive path contains no bends or kinks and has a minimum cross-sectional dimension of at least 1 micron, at least 1.5 microns, at least 2 microns, at least 2.5 microns, or at least 3 microns. Accordingly, the copper connector posts 8 exhibit minimal current losses when supplying power for an actuator in the inkjet nozzle assembly.

In a fourth sequence of steps, conductive metal pads 9 are formed, which are configured to minimize power losses in any regions of potentially high resistance. These regions are typically at the junction of the connector posts 8 with a thermoelastic element, and at any bends in the thermoelastic element. The thermoelastic element is formed in subsequent steps and the function of the metal pads 9 will be understood more readily once the nozzle assembly is described in its fully formed state.

Figure 11:
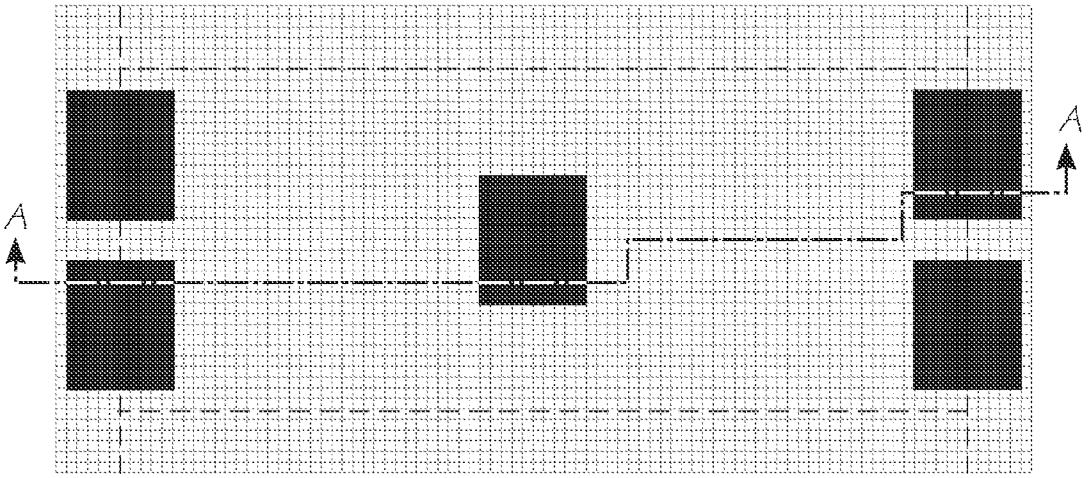
FIG. 11 is a mask for a metal plate etch.

The metal pads 9 are formed by initially depositing a 0.3 micron layer of aluminium onto the roof member 7 and connector posts 8. Any highly conductive metal (e.g. aluminium, titanium etc.) may be used and should be deposited with a thickness of about 0.5 microns or less so as not to impact too severely on the overall planarity of the nozzle assembly. Following deposition of the aluminium layer, a standard metal etch (e.g. $Cl_2/BCl_3$) is used to define the metal pads 9. The clear tone mask shown in FIG. 11 is used to pattern photoresist (not shown) which defines this etch.

Figure 12:
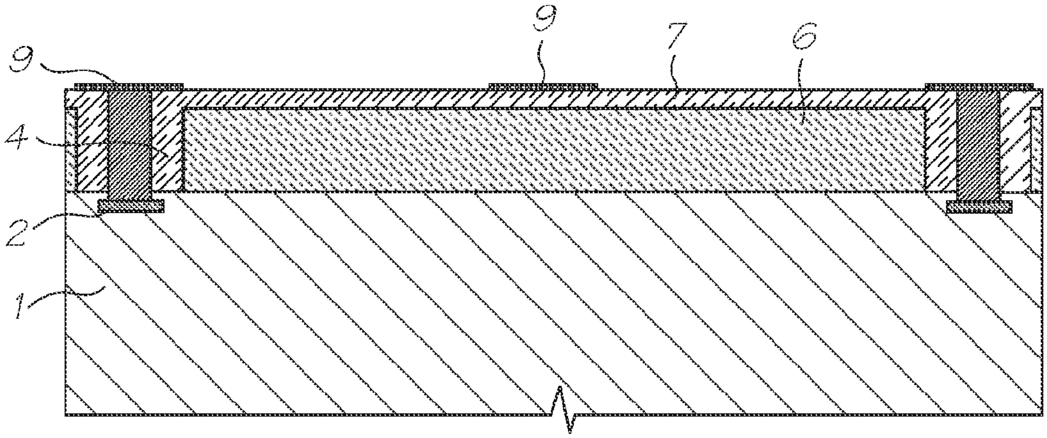
FIG. 12 is a side-sectional view of a partially-fabricated inkjet nozzle assembly after a fourth sequence of steps in which conductive metal plates are formed.
Figure 13:
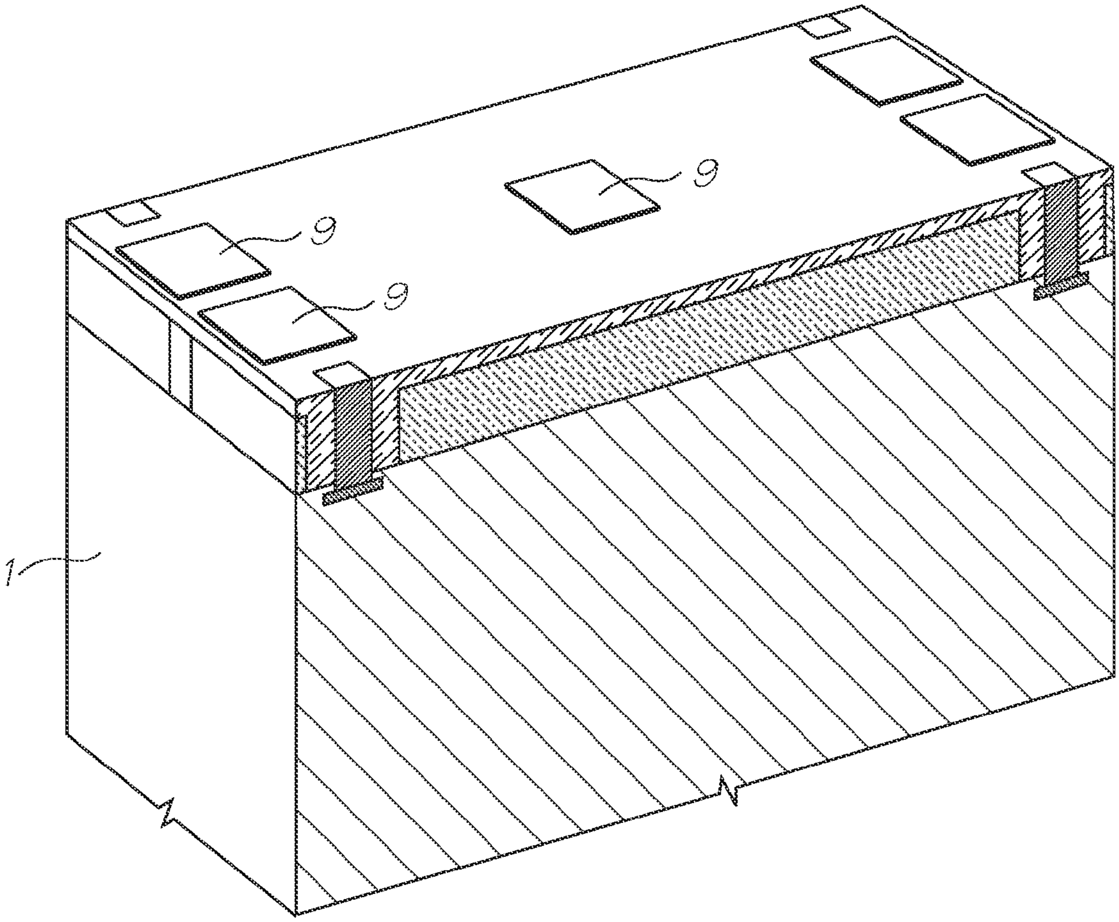
FIG. 13 is a perspective view of the partially-fabricated inkjet nozzle assembly shown in FIG. 12.

FIGS. 12 and 13 show the nozzle assembly after the fourth sequence of steps, with the metal pads 9 formed over the connector posts 8 and on the roof member 7 in predetermined 'bend regions' of the thermoelastic active beam member, which is to be formed subsequently. In the interests of clarity, the metal pads 9 are not shown on transversely adjacent nozzle assemblies in FIG. 13. However, it will of course be appreciated that all nozzle assemblies in the array are fabricated simultaneously and in accordance with the fabrication steps described herein.

Figure 14:
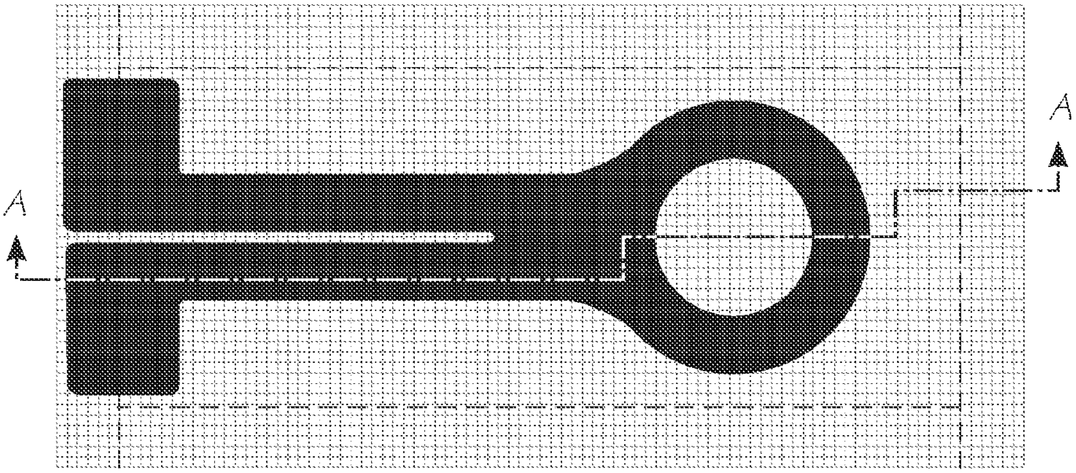
FIG. 14 is a mask for an active beam member etch.
Figure 15:
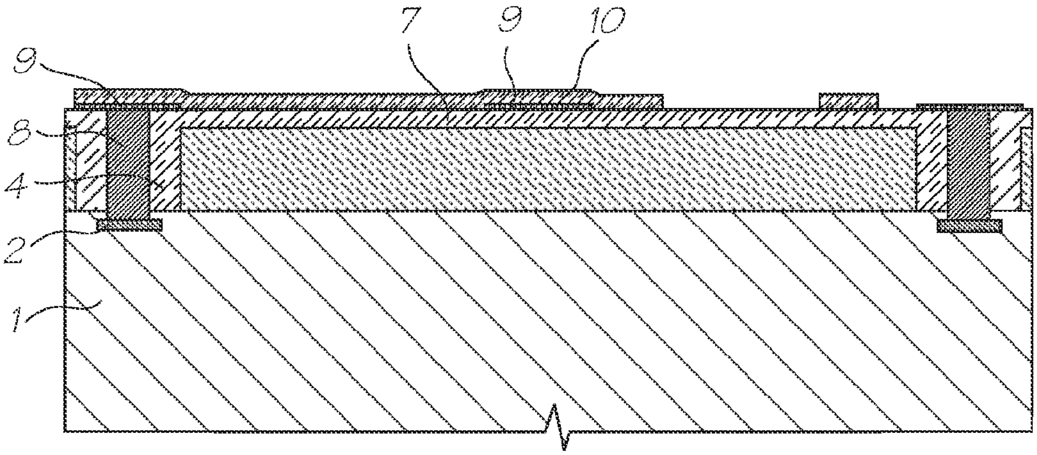
FIG. 15 is a side-sectional view of a partially-fabricated inkjet nozzle assembly after a fifth sequence of steps in which an active beam member of a thermal bend actuator is formed.
Figure 16:
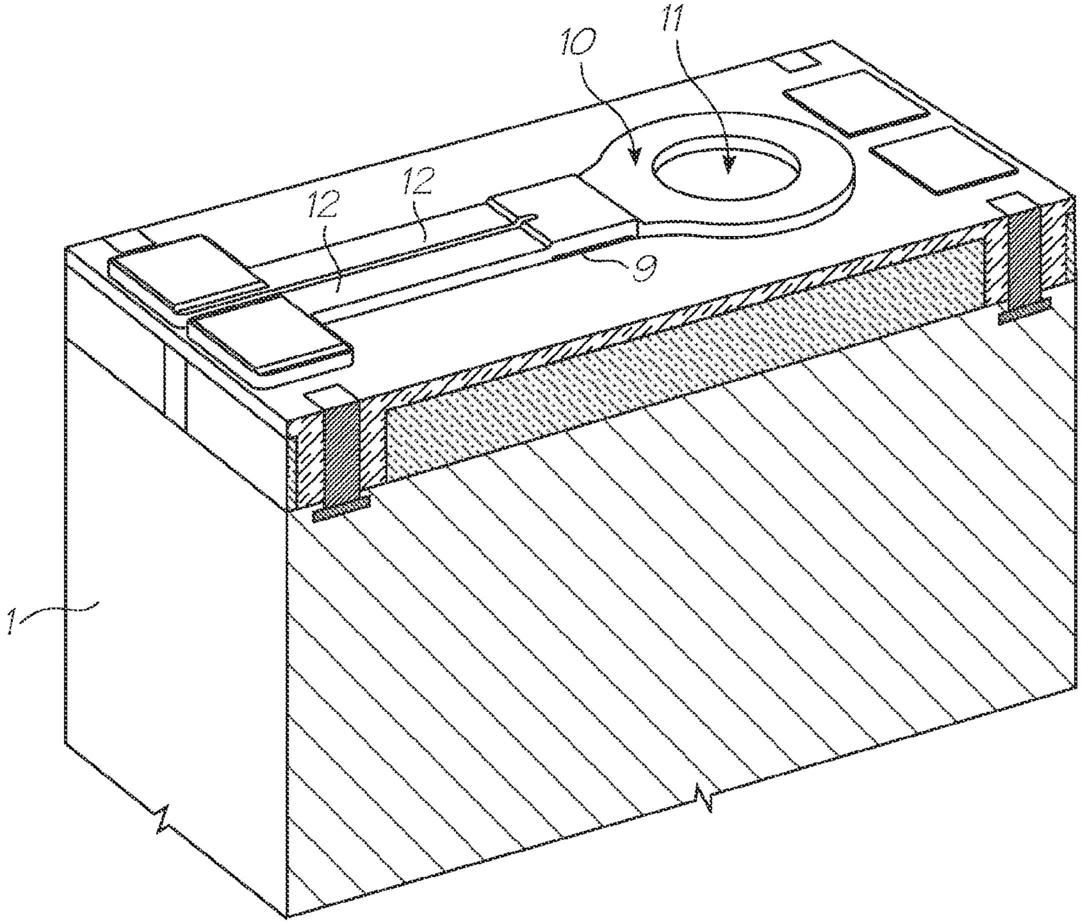
FIG. 16 is a perspective view of the partially-fabricated inkjet nozzle assembly shown in FIG. 15.

In a fifth sequence of steps exemplified by FIGS. 14 to 16, a thermoelastic active beam member 10 is formed over the $SiO_2$ roof member 7. By virtue of being fused to the active beam member 10, part of the $SiO_2$ roof member 7 functions as a lower passive beam member 16 of a mechanical thermal bend actuator, which is defined by the active beam 10 and the passive beam 16. The thermoelastic active beam member 10 may be comprised of any suitable thermoelastic material, such as titanium nitride, titanium aluminium nitride and aluminium alloys. As explained in the Applicant's copending U.S. application Ser. No. 11/607,976 filed on 4 Dec. 2002), vanadium-aluminium alloys are a preferred material, because they combine the advantageous properties of high thermal expansion, low density and high Young's modulus.

To form the active beam member 10, a 1.5 micron layer of active beam material is initially deposited by standard PECVD. The beam material is then etched using a standard metal etch to define the active beam member 10. The clear tone mask shown in FIG. 14 is used to pattern photoresist (not shown) which defines this etch.

After completion of the metal etch and as shown in FIGS. 15 and 16, the active beam member 10 comprises a partial nozzle opening 11 and a beam element 12, which is electrically connected at each end thereof to positive and ground electrodes 2 via the connector posts 8. The planar beam element 12 extends from a top of a first (positive) connector post and bends around 180 degrees to return to a top of a second (ground) connector post. Serpentine beam element configurations, as described in Applicant's copending U.S. application Ser. No. 11/607,976 are, of course, also within the ambit of the present invention.

As is shown most clearly in FIGS. 15 and 16, the metal pads 9 are positioned to facilitate current flow in regions of potentially higher resistance. One metal pad 9 is positioned at a bend region of the beam element 12, and is sandwiched between the active beam member 10 and the passive beam member 16. The other metal pads 9 are positioned between the top of the connector posts 8 and the ends of the beam element 12. It will appreciated that the metal pads 9 reduce resistance in these regions.

Figure 17:
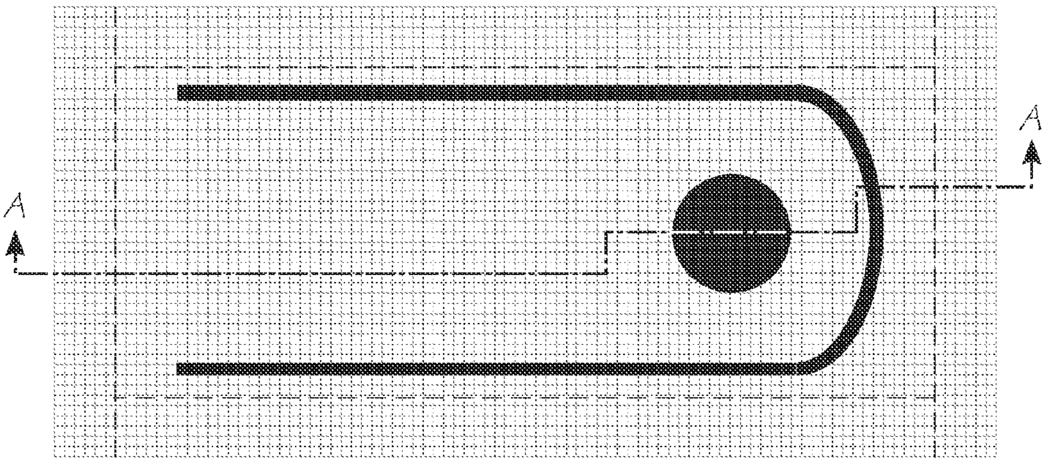
FIG. 17 is a mask for a silicon oxide roof member etch.
Figure 18:
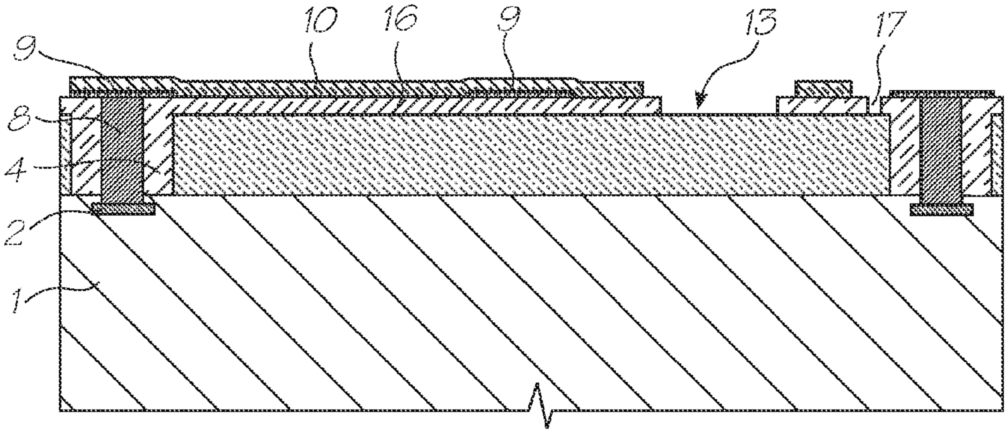
FIG. 18 is a side-sectional view of a partially-fabricated inkjet nozzle assembly after a sixth sequence of steps in which a moving roof portion comprising the thermal bend actuator is formed.
Figure 19:
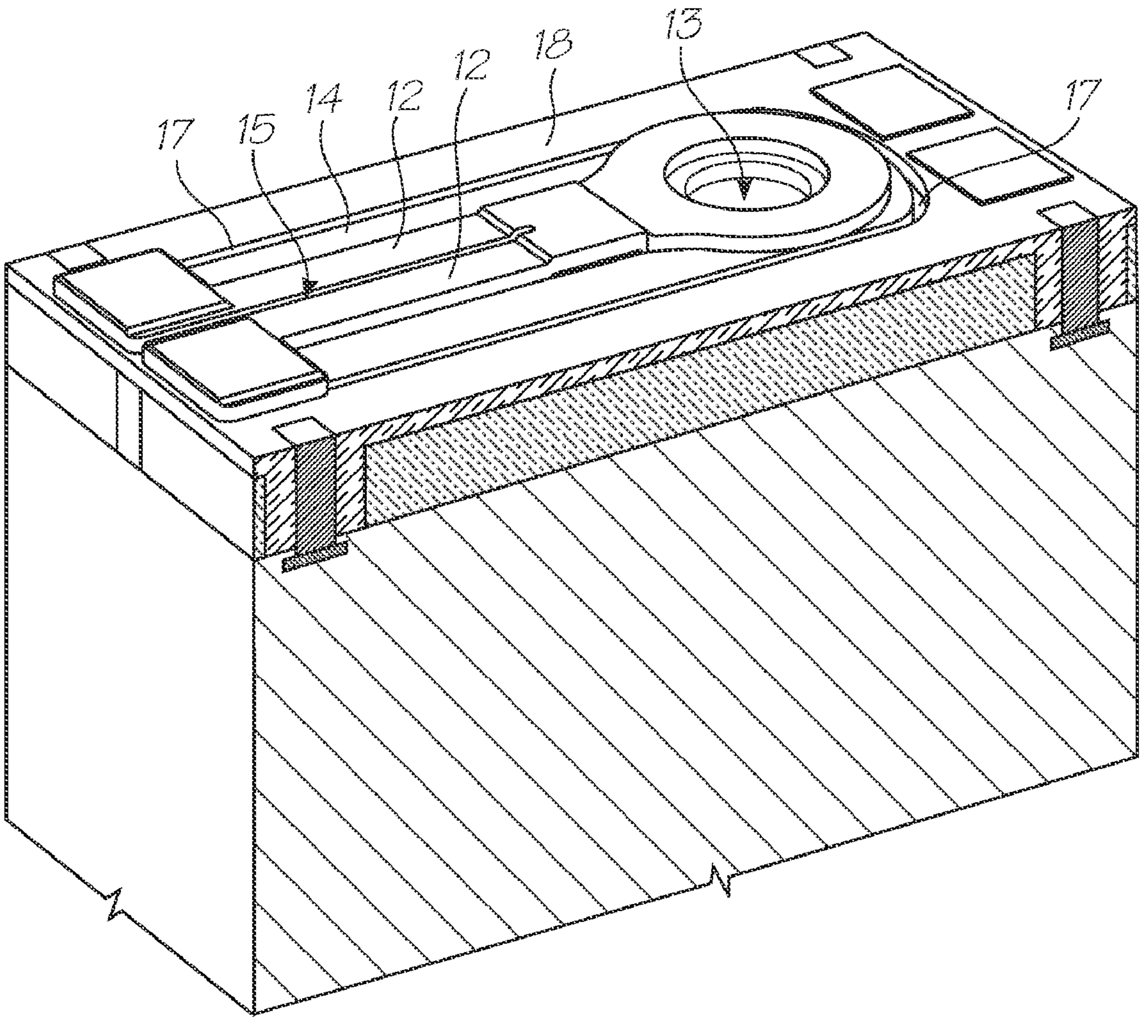
FIG. 19 is a perspective view of the partially-fabricated inkjet nozzle assembly shown in FIG. 18.

In a sixth sequence of steps, exemplified in FIGS. 17 to 19, the $SiO_2$ roof member 7 is etched to define fully a nozzle opening 13 and a moving portion 14 of the roof. The dark tone mask shown in FIG. 17 is used to pattern photoresist (not shown) which defines this etch.

As can be seen most clearly in FIGS. 18 and 19, the moving portion 14 of the roof, defined by this etch, comprises a thermal bend actuator 15, which is itself comprised of the active beam member 10 and the underlying passive beam member 16. The nozzle opening 13 is also defined in the moving portion 14 of the roof so that the nozzle opening moves with the actuator during actuation. Configurations whereby the nozzle opening 13 is stationary with respect to the moving portion 14, as described in U.S. application Ser. No. 11/607,976 are, of course, also possible and within the ambit of the present invention.

A perimeter gap 17 around the moving portion 14 of the roof separates the moving portion from a stationary portion 18 of the roof. This gap 17 allows the moving portion 14 to bend into the nozzle chamber 5 and towards the substrate 1 upon actuation of the actuator 15.

Figure 20:
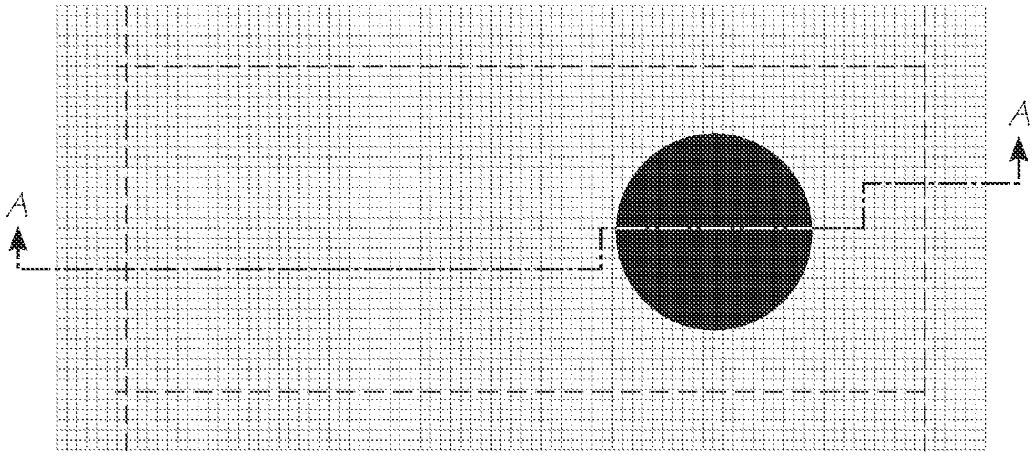
FIG. 20 is a mask for patterning a photopatternable hydrophobic polymer.
Figure 21:
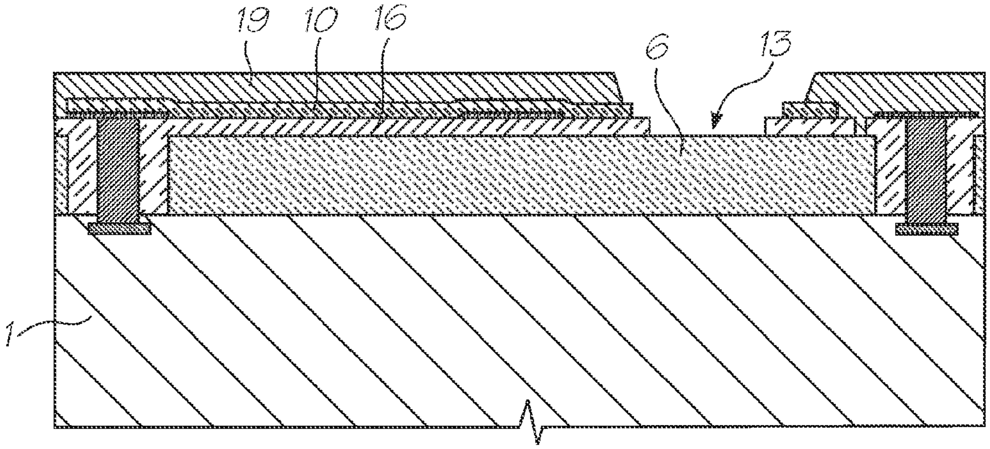
FIG. 21 is a side-sectional view of a partially-fabricated inkjet nozzle assembly after a seventh sequence of steps in which hydrophobic polymer layer is deposited and photopatterned.
Figure 22:
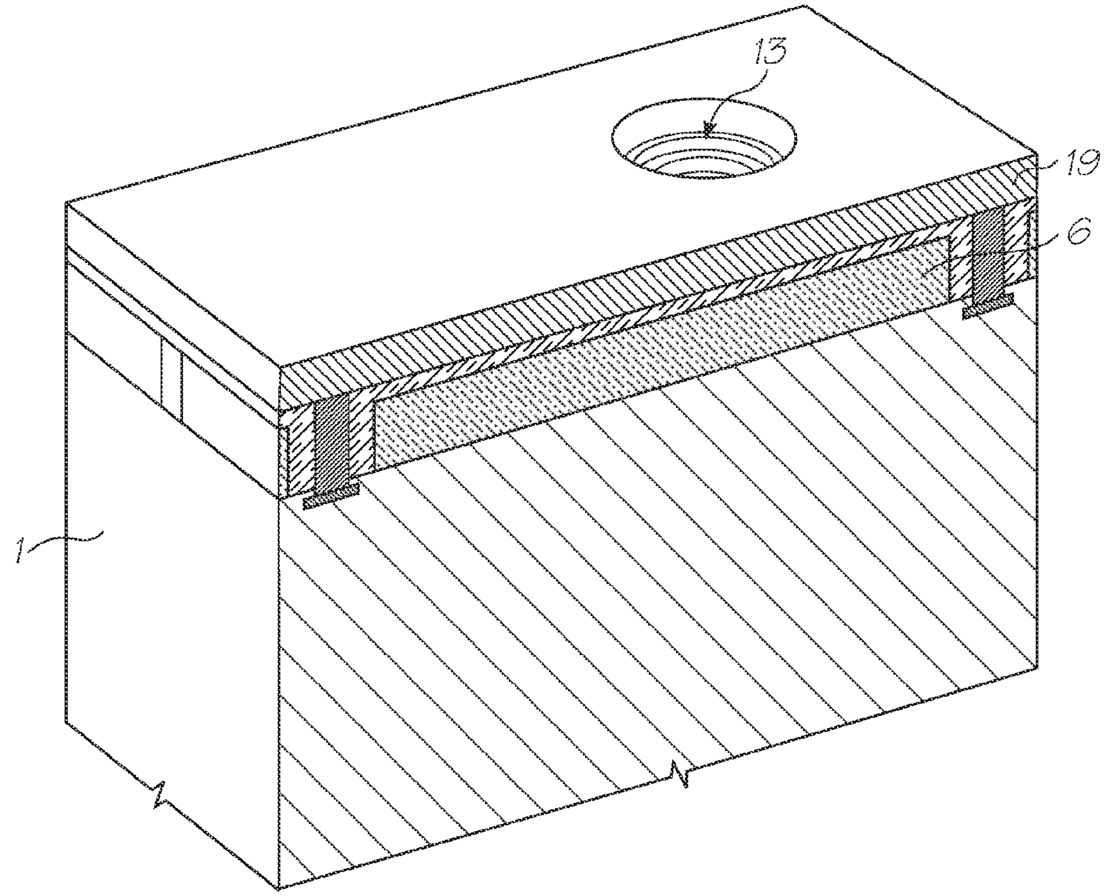
FIG. 22 is a perspective view of the partially-fabricated inkjet nozzle assembly shown in FIG. 21.
Figure 23:
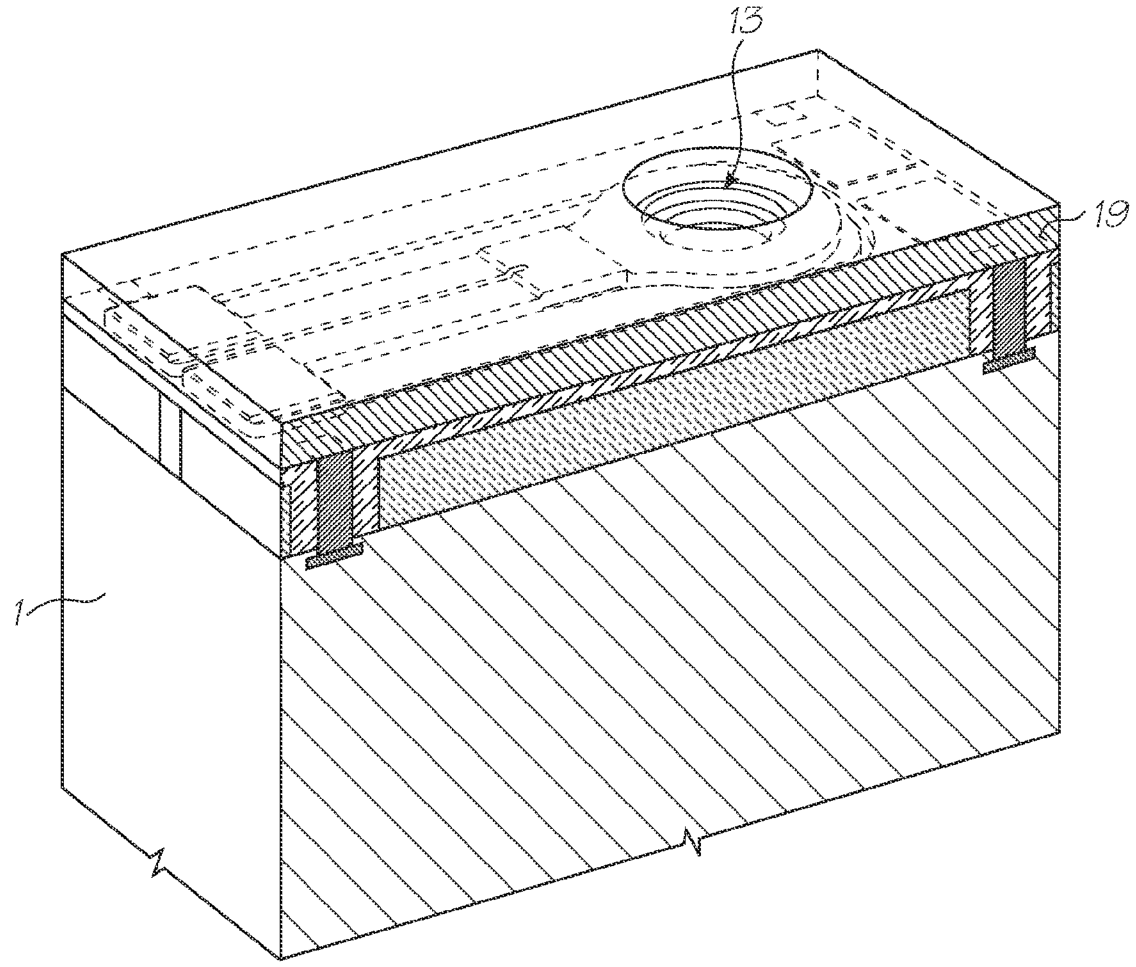
FIG. 23 is the perspective view of FIG. 22 with underlying MEMS layers shown in dashed lines.

In a seventh sequence of steps, exemplified in FIGS. 20 to 23, a 3 micron layer of photopatternable hydrophobic polymer 19 is deposited over the entire nozzle assembly, and photopatterned to re-define the nozzle opening 13. The dark tone mask shown in FIG. 20 is used to pattern the hydrophobic polymer 19.

The use of photopatternable polymers to coat arrays of nozzle assemblies was described extensively in our earlier U.S. application Ser. No. 11/685,084 filed on 12 Mar. 2007 and Ser. No. 11/740,925 filed on 27 Apr. 2007, the contents of which are incorporated herein by reference. Typically, the hydrophobic polymer is polydimethylsiloxane (PDMS) or perfluorinated polyethylene (PFPE). Such polymers are particularly advantageous because they are photopatternable, have high hydrophobicity, and low Young's modulus.

As explained in the above-mentioned US Applications, the exact ordering of MEMS fabrication steps, incorporating the hydrophobic polymer, is relatively flexible. For example, it is perfectly feasible to etch the nozzle opening 13 after deposition of the hydrophobic polymer 19, and use the polymer as a mask for the nozzle etch. It will appreciated that variations on the exact ordering of MEMS fabrication steps are well within the ambit of the skilled person, and, moreover, are included within the scope of the present invention.

The hydrophobic polymer layer 19 performs several functions. Firstly, it provides a mechanical seal for the perimeter gap 17 around the moving portion 14 of the roof. The low Young's modulus of the polymer (<1000 MPa) means that it does not significantly inhibit bending of the actuator, whilst preventing ink from escaping through the gap 17 during actuation. Secondly, the polymer has a high hydrophobicity, which minimizes the propensity for ink to flood out of the relatively hydrophilic nozzle chambers and onto an ink ejection face 21 of the printhead. Thirdly, the polymer functions as a protective layer, which facilitates printhead maintenance.

In a final, eighth sequence of steps, exemplified in FIGS. 24 to 26, an ink supply channel 20 is etched through to the nozzle chamber 5 from a backside of the substrate 1. The dark tone mask shown in FIG. 24 is used to pattern backside photoresist (not shown) which defines this etch. Although the ink supply channel 20 is shown aligned with the nozzle opening 13 in FIGS. 25 and 26, it could, of course, be offset from the nozzle opening, as exemplified in the nozzle assembly 400 shown in FIG. 1.

Following the ink supply channel etch, the polyimide 6, which filled the nozzle chamber 5, is removed by ashing (either frontside ashing or backside ashing) using, for example, an $O_2$ plasma to provide the nozzle assembly 100.

The resultant nozzle assembly 100 shown in FIGS. 25 and 26 has several additional advantages over the nozzle assembly 400 shown in FIGS. 1 and 2. Firstly, the nozzle assembly 100 has minimal electrical losses in the connection between the active beam 10 of the actuator and the electrodes 2. The copper connector posts 8 have excellent conductivity. This is due to their relatively large cross-sectional dimension (>1.5 microns); the inherent high conductivity of copper; and the absence of any bends in the connection. Accordingly, the copper connector posts 8 maximizes power transfer from the drive circuitry to the actuator. By contrast, the corresponding connection in the nozzle assembly 400, shown in FIGS. 1 and 2, is relatively thin, tortuous and generally formed of the same material as the active beam 411.

Secondly, the connector posts 8 extend perpendicularly from the surface of the substrate 1, allowing the height of the nozzle chamber 5 to be increased without impacting on the overall footprint area of the nozzle assembly 100. By contrast, the nozzle assembly 400 requires sloped connections between the electrode 416 and the active beam member 411 so that the connections can be formed by PECVD. This slope inevitably impacts on the overall footprint area of the nozzle assembly 400, which is particularly disadvantageous if the height of the nozzle chamber 401 were to be increased (for example, to provide improved drop ejection characteristics). In accordance with the present invention, nozzle assemblies having relatively large volume nozzle chambers can be arranged in rows with a nozzle pitch of, for example, less than 50 microns.

Thirdly, the nozzle assembly 100 has a highly planar ink ejection face 21, in the absence of any pit or via in the region of the electrodes 2. The planarity of the ink ejection face is advantageous for printhead maintenance, because it presents a smooth wipeable surface for any maintenance device. Furthermore, there is no risk of particles becoming trapped permanently in electrode vias or other contoured features of the ink ejection face.

It will, of course, be appreciated that the present invention has been described by way of example only and that modifications of detail may be made within the scope of the invention, which is defined in the accompanying claims.

The invention claimed is:

1. A method of forming a thermal bend actuator in an inkjet nozzle assembly, said method comprising the steps of:

(a) providing a substrate having a layer of drive circuitry, said drive circuitry including first and second electrodes for connection to the thermal bend actuator;

(b) depositing sidewalls and a roof layer to define a nozzle chamber, wherein a first sidewall is deposited over said first and second electrodes;

(c) defining first and second vias in said first sidewall, said vias revealing said first and second electrodes;

(d) filling said first and second vias with a conductive material using electroless plating to provide first and second connector posts, said first and second connector posts being adjacent each other;

(e) depositing an active beam material onto said roof layer such that said active beam material extends from said first and second connector posts in a plane perpendicular to said posts;

(f) etching said active beam material to define a planar active beam member comprising a bent or serpentine beam element, said beam element having a first end positioned over said first connector post and a second end positioned over said second connector post; and (g) etching said roof layer to define the thermal bend actuator, said thermal bend actuator being moveable towards said substrate upon actuation.

2. The method of claim 1, wherein a distance between said actuator and said electrode is at least 5 microns.

3. The method of claim 1, wherein said layer of drive circuitry is a CMOS layer of a silicon substrate.

4. The method of claim 1, wherein said sidewalls are comprised of silicon dioxide.

5. The method of claim 1, wherein said vias have sidewalls perpendicular to a face of said substrate.

6. The method of claim 1, wherein said vias have a minimum cross-sectional dimension of 1 micron or greater.

7. The method of claim 1, wherein said conductive material is a metal.

8. The method of claim 1, wherein said conductive material is copper.

9. The method of claim 1, comprising the further step of: depositing a catalyst layer on a base of said vias prior to said electroless plating.

10. The method of claim 9, wherein said catalyst is palladium.

11. The method of claim 1, wherein said conductive material is planarized by chemical mechanical planarization prior to forming said actuator.

12. The method of claim 1, further comprising the step of: depositing a first metal pad over a top of said first and second connector posts prior to deposition of said active beam material, said first metal pad being configured to facilitate current flow between the connector posts and the active beam member.

13. The method of claim 12, further comprising the step of: depositing one or more second metal pads onto said passive beam material prior to deposition of said active beam material, said second metal pad being positioned to facilitate current flow in bend regions of said beam element.

14. The method of claim 1, wherein said first and second connectors posts extend linearly from said electrodes.

* * * * *